(12) United States Patent
Yuferev et al.

(10) Patent No.: US 12,094,807 B2
(45) Date of Patent: Sep. 17, 2024

(54) STACKED TRANSISTOR CHIP PACKAGE WITH SOURCE COUPLING

(71) Applicant: Infineon Technologies AG, Neubiberg (DE)

(72) Inventors: Sergey Yuferev, Villach (AT); Paul Armand Asentista Calo, Villach (AT); Theng Chao Long, Melaka (MY); Josef Maerz, Oberhaching (DE); Chee Yang Ng, Muar (MY); Petteri Palm, Stein (DE); Wae Chet Yong, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 110 days.

(21) Appl. No.: 17/485,742

(22) Filed: Sep. 27, 2021

(65) Prior Publication Data
US 2022/0122906 A1 Apr. 21, 2022

(30) Foreign Application Priority Data
Oct. 16, 2020 (DE) .................. 10 2020 127 327

(51) Int. Cl.
*H01L 23/495* (2006.01)
*H01L 23/31* (2006.01)
*H01L 25/00* (2006.01)

(52) U.S. Cl.
CPC .... *H01L 23/49575* (2013.01); *H01L 23/3107* (2013.01); *H01L 23/49524* (2013.01); *H01L 23/49562* (2013.01); *H01L 25/50* (2013.01)

(58) Field of Classification Search
CPC .......... H01L 23/49575; H01L 23/3107; H01L 23/49524; H01L 23/49562; H01L 25/50
USPC ........................................... 257/676
See application file for complete search history.

(56) References Cited

U.S. PATENT DOCUMENTS

| | | | |
|---|---|---|---|
| 7,271,470 B1 | 9/2007 | Otremba | |
| 8,148,815 B2 | 4/2012 | Girdhar et al. | |
| 8,680,666 B2 | 3/2014 | Hauenstein | |
| 2005/0224945 A1* | 10/2005 | Saito | H01L 23/49575 257/E23.052 |
| 2019/0081562 A1* | 3/2019 | Palm | H01F 17/062 |
| 2020/0258824 A1* | 8/2020 | Maldo | H01L 23/3735 |

FOREIGN PATENT DOCUMENTS

| | | |
|---|---|---|
| DE | 10 2007 024 413 | 12/2007 |
| DE | 10 2007 025 248 | 12/2007 |
| WO | 2014/169209 | 10/2014 |

\* cited by examiner

*Primary Examiner* — Caleb E Henry
*Assistant Examiner* — Dilinh P Nguyen
(74) *Attorney, Agent, or Firm* — Dicke, Billig & Czaja, PLLC

(57) ABSTRACT

A package and method of manufacturing a package is disclosed. In one example, a package which comprises a first transistor chip having a first source pad and a second transistor chip having a second source pad and being stacked with the first transistor chip at an interface area. The first source pad and the second source pad are coupled at the interface area.

16 Claims, 13 Drawing Sheets

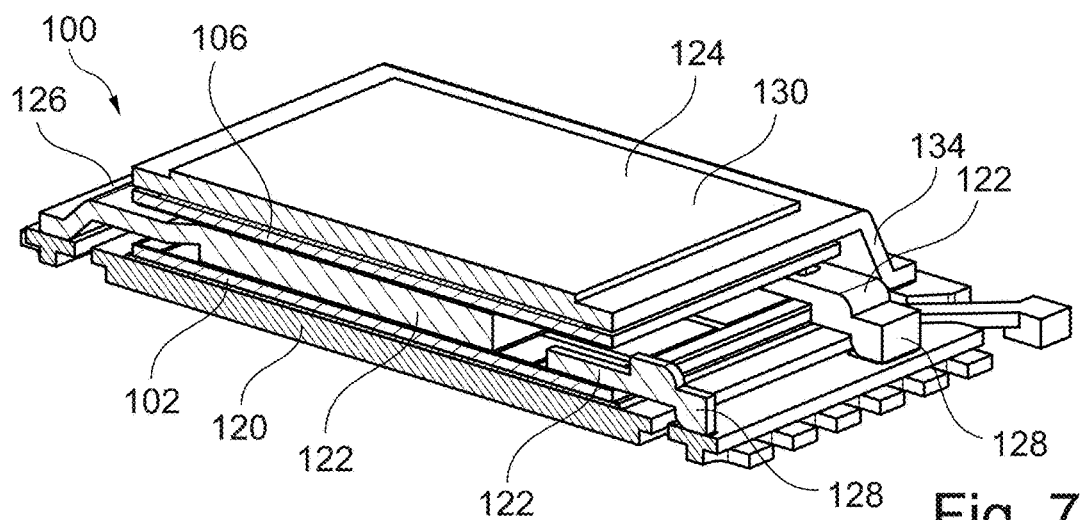
Fig. 7
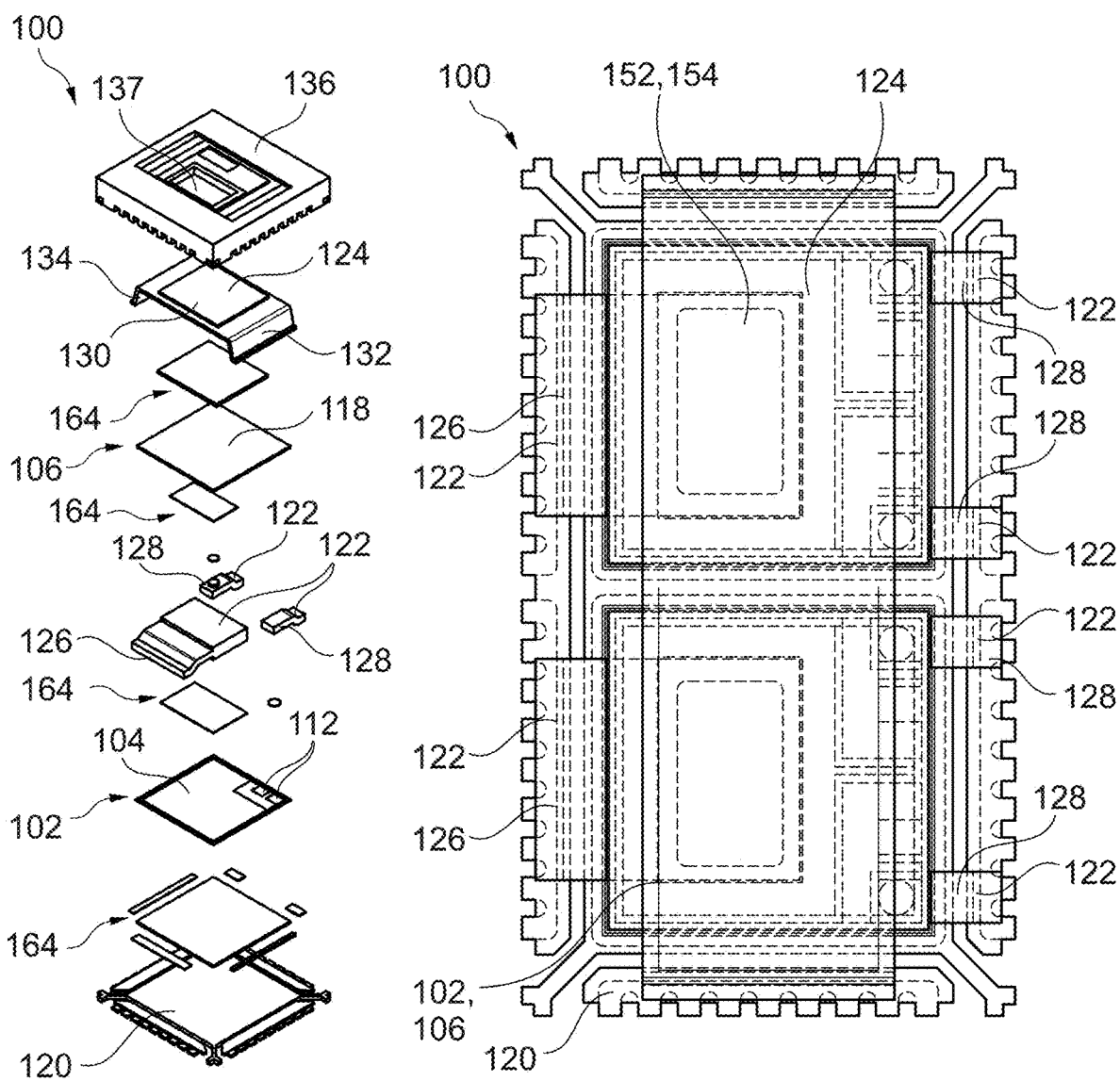
Fig. 8
Fig. 9

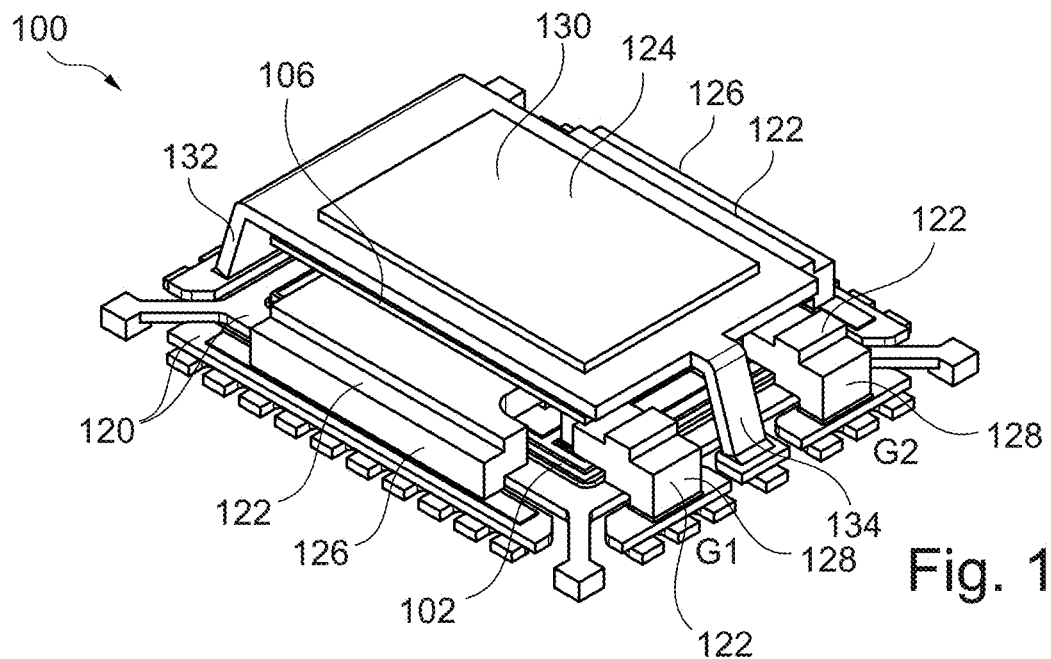
Fig. 17
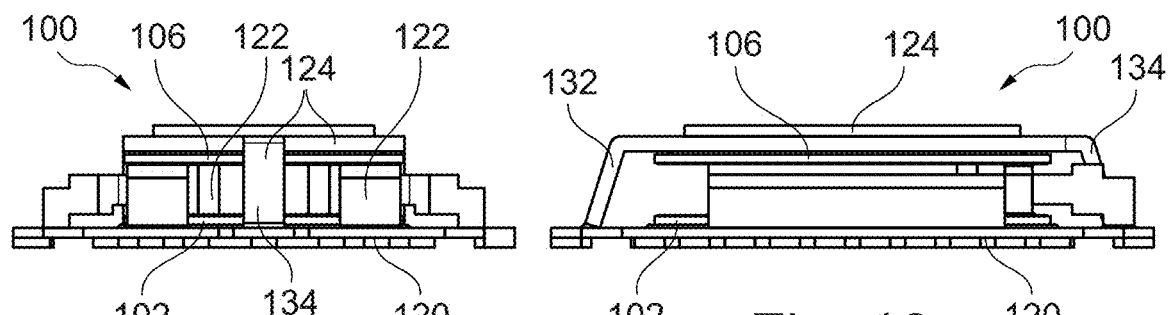
Fig. 18
Fig. 19
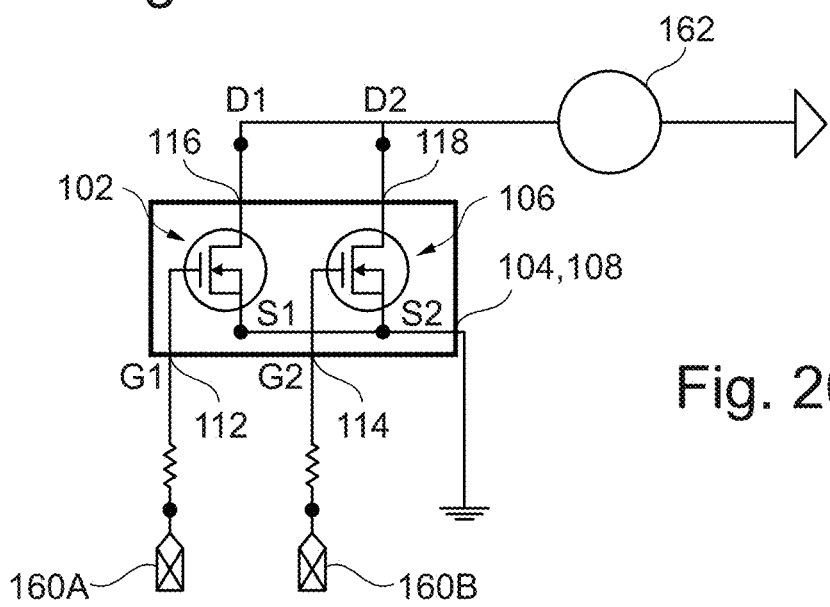
Fig. 20

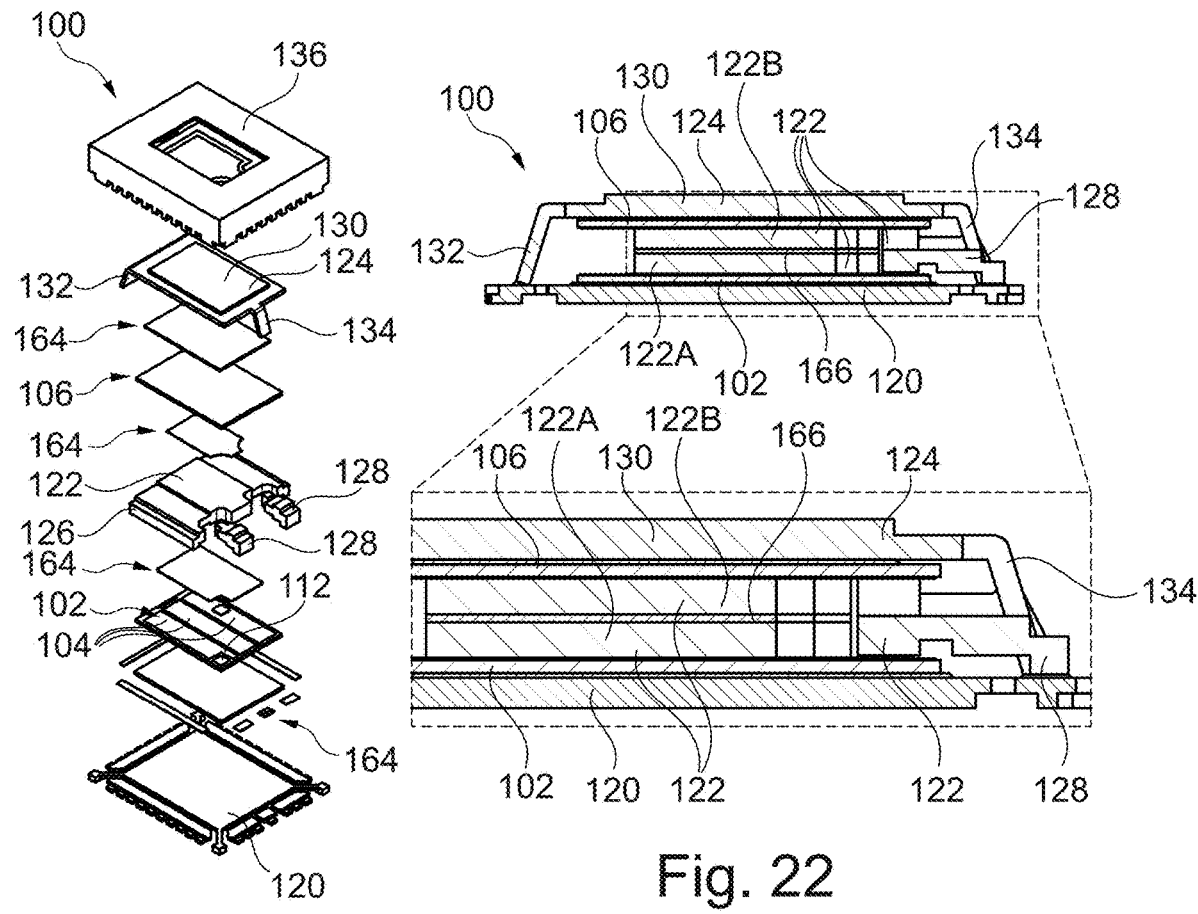
Fig. 21
Fig. 22
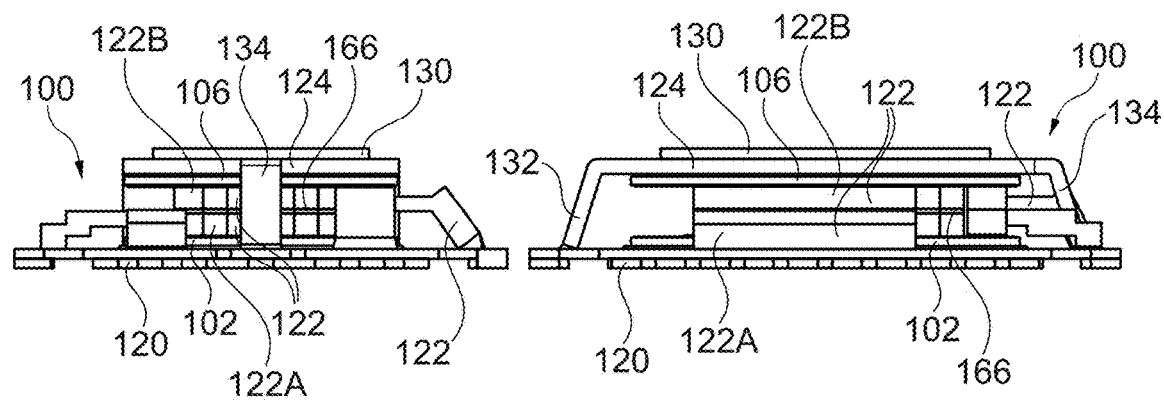
Fig. 23
Fig. 24

STACKED TRANSISTOR CHIP PACKAGE WITH SOURCE COUPLING

CROSS-REFERENCE TO RELATED APPLICATION

This Utility Patent Application claims priority to German Patent Application No. 10 2020 127 327.4, filed Oct. 16, 2020, which is incorporated herein by reference.

BACKGROUND

Various embodiments relate generally to a package and a method of manufacturing a package.

Packages may be denoted as usually encapsulated electronic components with electrical connects extending out of the encapsulant. For example, packages may be connected to an electronic periphery, for instance mounted on a printed circuit board, or mounted onto a heatsink and connected via connectors to a larger system.

Packaging cost is an important driver for the industry. Related with this are performance, dimensions and reliability. The different packaging solutions are manifold and have to address the needs of a specific application.

In particular packages with power semiconductor chips may generate a considerable amount of heat during operation. This may limit reliability and performance.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 3 to FIG. 5 and FIG. 7 and FIG. 8 illustrate different views of a package according to another exemplary embodiment.

FIG. 9 to FIG. 11 illustrate different views of a package according to another exemplary embodiment.

FIG. 17 to FIG. 19 and FIG. 21 illustrate different views of a package according to another exemplary embodiment.

FIG. 20 illustrates a circuit diagram of the aforementioned package.

FIG. 22 to FIG. 24 illustrate different views of a package according to another exemplary embodiment.

DETAILED DESCRIPTION

Figure 1:
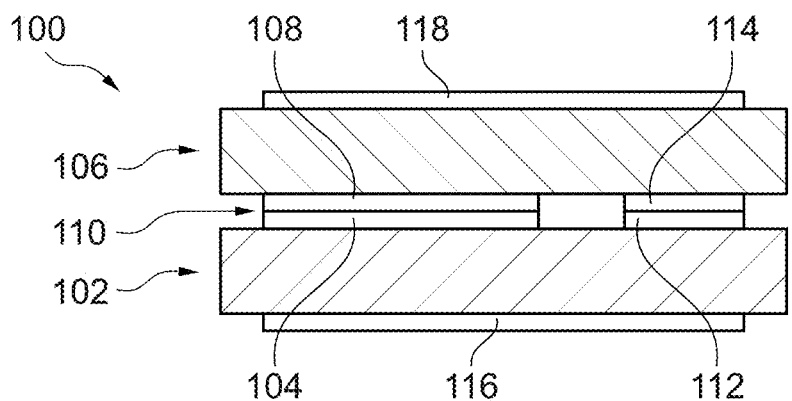
FIG. 1 illustrates a cross-sectional view of a package according to an exemplary embodiment.

There is a need for a package with proper reliability and performance.

According to an exemplary embodiment, a package is provided which comprises a first transistor chip having a first source pad, and a second transistor chip having a second source pad and being stacked with the first transistor chip at an interface area, wherein the first source pad and the second source pad are coupled at the interface area.

According to another exemplary embodiment, a method of manufacturing a package is provided, wherein the method comprises stacking a first transistor chip, having a first source pad, and a second transistor chip, having a second source pad, at an interface area, and coupling the first source pad and the second source pad at the interface area.

According to an exemplary embodiment, a package with a vertical stack of two source-coupled transistor chips is provided. Surprisingly, simulations have shown that stacked transistor chips with mutual source coupling are characterized by a low heat generation and in particular show a significantly lower power loss than a comparable design with drain coupling (compare for example FIG. 48 and FIG. 49). Without wishing to be bound to a specific theory, it is presently believed that a common source design does not strongly affect balancing currents through opposing exterior portions of the package. Highly advantageously, undesired regions of high loss and hotspots can thus be efficiently suppressed by source-coupling the stacked transistor chips. Consequently, a package with stacked source-coupled transistor chips may have a very low thermal resistance and an increased current gain. As a result, an obtained package shows an efficient heat removal and heat spreading and consequently an improved thermal reliability and performance. A package according to an exemplary embodiment may also have an enhanced current carrying capacity and a high power output. Hence, a package according to exemplary embodiments may be highly appropriate in particular for power semiconductor applications in which a considerable amount of heat may be created by the transistor chips during operation of the package. Synergistically, the vertical stacking of the transistor chips may result in a compact package design with short electrical paths leading to lower losses and high transmission quality of electricity. Further advantageously, a common source architecture may expose both drain pads at two opposing exterior sides of the stack of transistor chips, which may promote double-sided cooling via both large area drain pads. This may additionally contribute to an efficient heat removal away from the stacked transistor chips. Furthermore, the described package design may allow the provision of relatively large transistor chips being stacked for obtaining nevertheless a small footprint of the overall package.

In the following, further exemplary embodiments of the package and the method will be explained.

In the context of the present application, the term "package" may particularly denote electronic devices which may comprise semiconductor chips for instance mounted on and/or in a carrier, said carrier to comprise or consist out of a single part, multiple parts joined via encapsulation or other package components, a subassembly of carriers, or a carrier laminate. Said constituents of the package may be optionally encapsulated at least partially by an encapsulant, or embedded in a laminate.

In the context of the present application, the term "transistor chip" may in particular denote a device comprising a semiconductor material, such as a power semiconductor chip or an active electronic device, fulfilling a transistor function. In particular, the transistor chip may have at least one integrated circuit element in form of a transistor structure in the semiconductor material. The semiconductor chip may be a naked die or may be already packaged or encapsulated. Transistor chips implemented according to exemplary embodiments may be formed for example in silicon technology, gallium nitride technology, silicon carbide technology, etc.

In the context of the present application, the term "source pad" may particularly denote an electrically conductive structure functioning as a terminal coupled with a source region of a transistor, in particular a field effect transistor. Other pads of a transistor chip are a drain pad (i.e. a further electrically conductive structure functioning as a terminal coupled with a drain region of the transistor) and a gate pad (i.e. yet another electrically conductive structure functioning as a terminal coupled with a gate region of the transistor). Descriptively speaking, a control signal is to be applied to the gate pad for adjusting electric conductivity or non-conductivity between the source pad and the drain pad. In particular, the first transistor chip and the second transistor chip may be field effect transistors such as metal oxide semiconductor field effect transistors (MOSFETs) and insulated gate bipolar transistors (IGBTs).

In the context of the present application, the term "stacked transistor chips" may particularly denote an arrangement of transistor chips vertically above each other, with or without an intermediate structure in between the stacked transistor chips. In particular, the top-sided transistor chip may be provided in a flip-chip configuration in which the source pad and the gate pad are oriented downwardly, whereas the drain pad is oriented upwardly. The bottom-sided transistor chip may be arranged with the source pad and the gate pad oriented upwardly, whereas the drain pad may be oriented downwardly.

In the context of the present application, the term "interface area" may particularly denote a transition area or connection area between the transistor chips in a region where the transistor chips face each other.

In an embodiment, a first gate pad of the first transistor chip and a second gate pad of the second transistor chip are arranged at the interface area. Hence, source pads and gate pads may be arranged side-by-side on the same main surface of the respective transistor chip and therefore coplanar. Such a configuration may keep the package compact. The gate pads of the transistor chips may or may not be mutually coupled with each other.

In one embodiment, the first gate pad is coupled with the second gate pad. Such a configuration allows to apply a single control signal to the gates of both transistor chips. Thus, both gate pads may be commonly controlled.

In another embodiment, the first gate pad and the second gate pad are configured to be separately controllable. Hence, such an embodiment allows a separate individual control of the gates of the two transistor chips. As a result, the gates of the transistor chips may be driven individually, which may for instance be advantageous for a refined control in power steering applications. The option to drive the gate pads of the transistor chips separately may increase the flexibility for a circuit designer and may involve an advantageous redundancy in the package. Descriptively speaking, separate gate terminals provide the freedom to decide whether or not the transistor chips should be controlled exactly identically or individually and thus optionally differently.

In an embodiment, the first transistor chip has a first drain pad at a main surface of the first transistor chip facing away from the other main surface corresponding to the interface area. Additionally or alternatively, the second transistor chip may have a second drain pad at a main surface of the second transistor chip facing away from the other main surface corresponding to the interface area. By arranging the drain pads of the two transistor chips at two opposing main surfaces of the chip stack, heat may be removed efficiently from the transistor chip stack by a double-sided cooling architecture, i.e. via the exterior drains. This may further improve the thermal reliability and the electrical performance of the package.

In an embodiment, the first drain pad covers substantially said entire main surface of the first transistor chip. Additionally or alternatively, the second drain pad may cover substantially said entire main surface of the second transistor chip. When source pad and gate pad are arranged side-by-side on one main surface of the respective transistor chip (experiencing vertical current flow) facing towards the interface area, the entire opposing main surface of said transistor chip is available for the drain pad. Advantageously, this also means that substantially the entire exterior main surface of each of the transistor chips may be used for heat removal via the drain. Full surface coverage by the respective drain pad may therefore further increase the thermal reliability.

In an embodiment, the first drain pad is thermally coupled with an exterior of the package for removing heat. Additionally or alternatively, the second drain pad may be thermally coupled with an exterior of the package for removing heat. By establishing a thermally conductive path from the respective drain pad up to an exterior surface of the package, an efficient heat removal can be further promoted. Particularly advantageous is a configuration in which such thermal paths are established for both opposing drain pads.

In an embodiment, the first drain pad and the second drain pad are electrically coupled with each other. Hence, a single drain terminal can be created for the package.

In an embodiment, the first transistor chip and the second transistor chip are connected to function as a single common transistor. Rather than providing one transistor chip, stacking of two transistor chips with at least partially pairwise coupled corresponding pads may allow to create a package with relatively large chips and nevertheless a small footprint. Advantageously, source pads of the stacked transistor chips may be coupled with each other, drain pads of the stacked transistor chips may be coupled with each other, and gate pads of the stacked transistor chips may either be coupled with each other or may be separately controllable. In particular a separate control of the gate pads of the two stacked transistor chips functioning as a common single transistor increases the freedom of design and allows a sophisticated control of the package.

In one embodiment, the first transistor chip and the second transistor chip have identical shapes and dimensions. Hence, only a single type of transistor chip is sufficient for creating such a package.

In another embodiment, the first transistor chip and the second transistor chip have different shapes and/or dimensions. Thus, an individual separate design of the transistor chips is possible for refining the package configuration in accordance with a specific application.

In an embodiment, the package comprises a carrier (in particular a leadframe) on which the first transistor chip is mounted. In the context of the present application, the term "carrier" may particularly denote a support structure (preferably, but not necessarily electrically conductive) which serves as a mechanical support for said transistor chip, and which may also contribute to the electric interconnection between the transistor chip(s) and the periphery of the package. In other words, the carrier may fulfil a mechanical support function and an electric connection function. A carrier may comprise or consist of a single part, multiple parts joined via encapsulation or other package components, or a subassembly of carriers.

For instance, the carrier may comprise a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). For instance, such a stack-type carrier may be a Direct Copper Bonding (DCB) substrate, or a Direct Aluminium Bonding (DAB) substrate. However, the carrier may also be configured as Active Metal Brazing (AMB) substrate, or as patterned metal plate (for example a leadframe).

In an embodiment, the package comprises an electrically conductive first clip arranged at least partially in the interface area between the first transistor chip and the second transistor chip, i.e. may be sandwiched in between. A clip may be a three-dimensionally bent plate-shaped metallic structure configured for establishing an electric contact between electrically conductive structures arranged at different vertical levels. A clip may be embodied as a single integral structure or as an arrangement comprising a plurality of island-shaped structures. The mentioned first clip may be partially arranged between the bottom transistor chip and the top transistor chip and may function to guide electric signals between chip pads in the interface area and to a portion of the package exterior of the stacked transistor chips.

In an embodiment, the first clip has a first coupling section coupling the first source pad and the second source pad with the carrier. Since the first source pad and the second source pad are electrically coupled with each other, a common first coupling section of the first clip may be sufficient for both source pads.

In an embodiment, the first clip has a second coupling section coupling the first gate pad and the second gate pad with the carrier. The first coupling section and the second coupling section may be separate electrically conductive structures, allowing to electrically disconnect the source pads from the gate pads.

In an embodiment, the first coupling section and the second coupling section are arranged at two opposing sides or at two or three adjacent sides of the first clip. Thus, a source signal on the one hand and one or two gate signals on the other hand may be conducted along different paths defined by the respective coupling section of the first clip and may therefore be spatially separated. In one configuration, two opposing sides of the first clip may be used for guiding the electric signals. In another configuration, three adjacent sides of the first clip may be used for guiding the electric signals.

In an embodiment, the package comprises a second electrically conductive clip coupling the second drain pad with the carrier. A central portion of the second clip may be arranged above a central portion of the first clip and on top of the upper transistor chip. By taking this measure, a drain signal may be conducted between the bottom-sided carrier and the top-sided drain pad of the top-sided transistor chip. Simultaneously, the described second clip path may establish an additional thermal path conducting heat between the top-sided drain pad and the carrier, for instance a copper leadframe. This may further improve the thermal performance of the package. The central portion of the second clip may be preferably flat, which may additionally promote heat removal towards a top side of the package.

In an embodiment, the second clip has a plate-shaped section on the second drain pad and one or more (preferably at least two opposing) coupling sections extending downwardly for coupling the plate-shaped section with the carrier. Providing a plurality of slanted or curved coupling sections may ensure a low ohmic conduction of the drain signals as well as the realization of multiple thermal paths for cooling.

In a corresponding embodiment, the method may comprise mounting the first transistor chip on a carrier, connecting an electrically conductive first clip between the interface area and the carrier, mounting the second transistor chip on the first clip, and subsequently connecting an electrically conductive second clip between a top side of the second transistor chip and the carrier. Such a manufacturing method is simple and straightforward and allows to produce the packages with high throughput on an industrial scale.

In an embodiment, the package comprises an encapsulant encapsulating at least part of the first transistor chip and at least part of the second transistor chip. For example, such an encapsulant may be a mold compound or a soft encapsulant. In the context of the present application, the term "encapsulant" may particularly denote a substantially electrically insulating and preferably thermally conductive material surrounding at least part of the transistor chips to provide mechanical protection, electrical insulation, and optionally a contribution to heat removal during operation.

In one embodiment, the encapsulant may be applied by overmolding the transistor chips, and optionally one or more clips and/or a carrier. Advantageously, an upper clip may be subsequently exposed beyond the encapsulant by grinding. Keeping the upper surface of the upper clip exposed may also be accomplished by film-assisted molding, i.e. by covering the upper surface of the clip with a temporary film directly during encapsulation.

In an embodiment, an upper main surface of the second clip is exposed beyond the encapsulant. By exposing the upper main surface of the second clip with respect to an environment of the package, the heat removal capability of the second clip may be further enhanced. For instance, this may make it possible to connect a heat sink (such as a cooling plate with cooling fins) to the exposed surface of the second clip. Optionally, a thermal interface material (TIM) may also be applied to the exposed surface of the second clip.

In another embodiment, the package comprises a first laminate in which the first transistor chip is embedded, a second laminate in which the second transistor chip is embedded, and a connection structure, in particular a solder structure, arranged in the interface area between the first laminate and the second laminate and configured for coupling the first transistor chip with the second transistor chip. Accordingly, the method may comprise embedding the first transistor chip in a first laminate, embedding the second transistor chip in a second laminate, and thereafter connecting the first laminate with the second laminate by an electrically conductive connection structure, in particular a solder structure. A laminate may be an interconnected layer stack of metallic layers or structures (for instance made of copper) and of dielectric layers or structures (for instance made of prepreg). For instance, such a laminate may be a printed circuit board (PCB) laminate. Rather than being molded, the respective transistor chips may be pressed, preferably supported by heat, inside of the respective laminate, i.e. between different laminated layers. The connection structure between the first and second laminates may for instance be a solder structure (in particular for diffusion soldering), a sinter structure, or an adhesive (in particular an electrically conductive glue). Other connection techniques may be implemented as well. The connection structure may comprise a single integral structure or a plurality of (for example three or four) island-shaped substructures for different pads. By connecting the laminate-embedded transistor chips by a connection structure in between, a highly compact configuration may be achieved. Advantageously, chip embedding may be performed separately for each of the two laminates, before the readily manufactured laminates may be interconnected by the connection structure, preferably by soldering.

In another embodiment, the package comprises a laminate in which the first transistor chip is embedded, an encapsulant (in particular a mold compound) in which the second transistor chip is encapsulated, and a connection structure, in particular a leadframe, arranged in the interface area between the laminate and the encapsulant and configured for coupling the first transistor chip with the second transistor chip. In such an embodiment, a hybrid package with a mold-type encapsulated transistor chip and a PCB-embedded other transistor chip may be created using a connection structure in between. Such a hybrid may synergistically combine the advantages of encapsulation (in particular keeping the manufacturing effort small and leading to highly appropriate heat removal properties) and chip embedding (resulting in a compact configuration in particular in a vertical direction). As an alternative to a patterned metal plate such as a leadframe, the mentioned connection structure may also be embodied as a solder structure or the like. A leadframe may realize source coupling (and optionally gate coupling).

In an embodiment, the package comprises a metallic structure for coupling the first transistor chip with the second transistor chip. For example, the metallic structure may comprise at least one of the group consisting of at least one continuous metal layer (for instance a copper foil), at least one patterned metal layer (for example a structured copper foil), at least one vertical metal element (for instance a via or pillar), and at least one electrically conductive clip (i.e. a bent and patterned metal plate). Other metallic connection structures may be possible as well. For instance, such metallic structures may be integrated in the above-mentioned laminates. Additionally or alternatively, such metallic structures may be at least partially encapsulated in a mold compound or another encapsulant. Further additionally or alternatively, such metallic structures may be arranged outside of a laminate and/or an encapsulant. With a clip-type metallic structure, another hybrid package may be manufactured by combining PCB-embedded chips with a top side clip.

In an embodiment, part of the metallic structure connects a top side of the second transistor chip with a bottom side of the package and partially extends to laterally enclose the first transistor chip and the second transistor chip. For instance, said metallic structure may be configured for encompassing or laterally surrounding a laminate and/or an encapsulant for interconnecting the transistor chips.

In an embodiment, the package comprises a third transistor chip and a fourth transistor chip stacked on the third transistor chip, wherein the third transistor chip and the fourth transistor chip are arranged laterally to the first transistor chip and the second transistor chip. By arranging a plurality of double-chip stacks (each comprising two stacked transistor chips) side-by-side, the package may be easily and freely scaled to any desired number of transistor chips. For instance, the different double-chip stacks may be electrically and functionally interconnected, for instance by individual and/or shared clips. Together, they may function either as a single transistor or as an arrangement of interconnected transistors. When interconnecting multiple double-chip stacks, even more complex circuits such as an inverter, a half-bridge, a full-bridge or a B6 bridge may be constructed. Advantageously, the described package architecture is freely scalable within a horizontal plane and may be extended in accordance with the requirements of a specific application. In particular, multiple double-chip stacks may be connected by the same (in particular first and second) clip(s). It is also possible that more than two transistor chips are stacked on top of each other.

In an embodiment, at least one of the first transistor chip and the second transistor chip is configured for a vertical current flow. In particular, electric current may flow between a pad on a lower main surface of the respective transistor chip through semiconductor material of the respective transistor chip to another pad at an upper main surface of the respective transistor chip.

In an embodiment, the transistor chips may form at least one of the group consisting of a controller circuit, a driver circuit, and a power semiconductor circuit. All these circuits may be integrated into chips. For instance, a corresponding power semiconductor application may be realized by the chips, wherein integrated circuit elements of such a power semiconductor chip may comprise at least one transistor (in particular a MOSFET, metal oxide semiconductor field effect transistor, or an insulated gate bipolar transistor, IGBT), at least one diode, etc. In particular, circuits fulfilling a half-bridge function, a full-bridge function, etc., may be manufactured.

In an embodiment, the package is configured as a power converter, in particular one of an AC/DC power converter and a DC/DC power converter. However, also other electronic applications, such as inverters, etc. may be possible.

As substrate or wafer for the transistor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematic and not to scale.

Before exemplary embodiments will be described in more detail referring to the figures, some general considerations will be summarized based on which exemplary embodiments have been developed.

According to an exemplary embodiment, a package configured as a stacked transistor chips device is provided having a common source connection between the transistor chips in the middle between the transistor chips. A corresponding interface area between the transistor chips and accomplishing the source-coupling may for instance be equipped with a common clip or a common connection layer (such as a leadframe, a solder layer, etc.).

Such a common-source architecture may advantageously result in a lower heating than a comparable common-drain architecture. This is confirmed by simulations. Such an architecture may spatially distribute current more evenly and may thereby avoid hotspots resulting in an undesired local increase of the ohmic resistance. Moreover, source-coupling in an interface area between stacked transistor chips may allow to use exposed full drain areas for cooling and heat spreading, preferably via two opposing main surfaces of the package. Moreover, the source-coupling architecture may advantageously reduce the drain-source on-resistance (RDSon) of the transistor chips. Descriptively speaking, RDSon may denote a total resistance between the drain and source in a MOSFET when the MOSFET is "on" and may be the basis for a maximum current rating of the MOSFET. Beyond this, a common-source configuration allows to configure the package with a high degree of symmetry and allows to balance the current flow easier than with a common drain configuration.

According to a first aspect of the disclosure, a stacked parallel MOSFET package is provided. Parallel MOSFETs may be in particular suitable for loads with high power requirements. Moreover, parallel MOSFET circuits may have the benefit of a lower thermal resistance because of distributed current channels which enable less than a maximum rated current flow, which lowers heating and its induced resistance. Furthermore, a parallel MOSFET package may enable an increased current gain.

Conventional parallel MOSFET applications require two or more separate MOSFET devices mounted on separate areas on a board. This design requires significant board space. Consequently, such a conventional approach is also prone to current and thermal unbalance.

According to an exemplary embodiment, a stacked transistor chip configuration is provided which may benefit from P-N half-bridge MOSFETs to save board space. In particular, an exemplary embodiment provides a parallel MOSFET circuit in a stacked configuration. Such an architecture may lead to an enhanced current carrying capacity and a higher power output. Advantageously, a corresponding package may generate a lower amount of heat because distributed current channels may enable a maximum rated current flow which lowers heating and its induced resistance. Furthermore, an exemplary embodiment may lead to an enhanced heat dissipation through dual-side cooling, which becomes possible by exteriorly exposing drain pads which becomes possible due to a central source coupling. Furthermore, proper cooling may be further enhanced through the implementation of a top clip connected on both sides to bottom leads of a carrier. Descriptively speaking, heat may also dissipate via these side paths or side walls and to the vias through the bottom leads. As a consequence of such an architecture, current gain may increase, and a small footprint may be achieved. Advantageously, a corresponding package design is scalable, since one or more additional double-chip stacked MOSFETS can be added laterally. Preferably, middle and top clips may be connected on both sides to a carrier (such as a leadframe) in a bridge configuration, resulting in a highly stable structure and being consistent with a proper bond line thickness.

Moreover, a parallel MOSFET circuit in stacked configuration may improve a current-carrying capacity of the package. An effective chip size may be increased, thereby reducing a drain-source on-resistance (RDSon), while maintaining a small footprint. Top side cooling may be implemented to further improve heat dissipation. Furthermore, a top clip may also be connected to a frame to dissipate heat towards the frame and to vias. Middle and top clips may be connected on both sides to a leadframe in a bridge configuration, resulting in a more stable structure and consistent bond line thickness. Advantageously, the described package configuration is freely scalable, since multiple two-layer stacked MOSFETs can be added laterally. In yet another embodiment, more than two transistor chips (and in particular a plurality of stacked transistor chip pairs) may be vertically stacked. Beyond this, exemplary embodiments may achieve a lower on-resistance per PCB area by stacking two (or more) identical MOSFETs in one package.

Further advantageously, a built-in dual side cooling function may be provided to manage a higher power density by a second heat dissipation path on top. Cooling may be further enhanced through a thick top clip connected to bottom leads which may be connected to thermal vias in a PCB. Beyond this, a higher current carrying capacity may be achieved by avoiding small solder joint areas. As a result, substantially no electromigration limitation may occur.

Advantageously, the described package concept is freely scalable within a horizontal plane and depending on the needed power. More specifically, several stacked MOSFETs can be combined in one package depending on the needed number of switches. Consequently, even more sophisticated electronic circuits may be constructed on this basis.

Concluding, an integrated parallel MOSFET circuit in a stacked package configuration may be provided that reduces footprint requirement. Advantageously, the manufacture of such a package may require only a relatively small board space. An obtained package is neither prone to current unbalance nor prone to thermal unbalance. In particular, a parallel MOSFET circuit may be provided in which two MOSFETs are arranged in an opposing vertical array with a first MOSFET facing a second MOSFET, for improved current-carrying capacity. Apart from this, an effective chip size may be increased, thereby reducing RDSon, while maintaining a small footprint. Separated gate connections can either be shorted (for establishing a common gate) for a simultaneous on-state of the two MOSFETs. Alternatively, the package may be equipped with separated gates where the first MOSFET may be "on" while the second MOSFET is "off", or the first MOSFET is "off" while the second MOSFET is "on".

According to a second aspect of the disclosure, stacked embedded chips discrete devices may be provided.

In particular, a discrete device concept is provided which features significantly lower resistance and inductance values than conventional single-chip and multi-chip devices. For this purpose, a stacked embedded chips discrete device concept is disclosed in which two or more chips are embedded in a PCB-type package (i.e. in chip embedding technology). This may enable to accommodate even larger chips as compared with stacked die devices employing leadframe technology.

In an embodiment, the transistor chips may be positioned parallel to a footprint plane one above the other one. One or both transistor chips may be flipped and electrically connected (in particular with a parallel connection) with common drain, source and gate paths. Advantageously, source pads of the stacked transistor chips may be connected in an interface area between the transistor chips.

Top and bottom drain paths in a stacked dual-chip configuration may have different lengths. In particular, the top path may be longer. Since this may misbalance the current flow through the field-effect transistors (the top transistor chip may be underloaded and the bottom transistor chip can be overloaded), this phenomenon may be advantageously reduced by increasing a cross section area of the top drain path.

Furthermore, a common source path in the package may also have a large cross sectional area because it carries two times higher current than each drain path. A corresponding package may yield a smoother current density distribution with lower peak values and, consequently, an additional reduction of the package resistance.

Further advantages of the second aspect are the options to obtain an ultra-low RDSon value of the package. Furthermore, a significant reduction of conduction losses up to two times as compared with single-chip devices may be achieved. Apart from this, an ultra-low package inductance can be obtained, as well as a reduction of switching losses. Moreover, a lower package resistance as compared to benchmark packages may be achieved. The described package architecture is furthermore compatible with double-sided cooling (i.e. via a top side and a bottom side) and allows a further enhancement of heat removal by the option to attach one or more heat sinks. Embodiments may also lead to a smooth electric current distribution in the package and at chip-package interfaces. Beyond this, a very slow growth of the package resistance with frequency may be obtained as compared with benchmark packages. Moreover, oppositely directed current paths may ensure low radiated emissions. Exemplary embodiments may also improve the electrical performance of the package.

According to a preferred embodiment of the second aspect, a stacked embedded chips discrete device may be provided. Accommodation and parallel connection of two twin transistor chips may reduce the overall drain-source on-resistance of the device by two times as compared with a single chip lateral discrete device. The use of chip embedding technology may enables to accommodate larger chips (as compared with stacked die discrete devices based on leadframe technology) and may significantly reduce package resistance. A modular approach implemented in a package according to an exemplary embodiment may enable to manufacture devices with two or more embedded transistor chips. Crossing two-directional current flows together with wide planes and overall low thickness of the device may provide a very low parasitic inductance and slow growth of the device resistance with the frequency. Thermal properties may be enhanced by double-sided cooling.

FIG. 1 illustrates a cross-sectional view of a package 100 according to an exemplary embodiment.

The illustrated package 100 comprises a first transistor chip 102. The first transistor chip 102 has a first source pad 104, a first gate pad 112 and a first drain pad 116. Moreover, package 100 comprises a flipped second transistor chip 106 having a second source pad 108, a second gate pad 114 and a second drain pad 118. The second transistor chip 106 is stacked on the first transistor chip 102 at an interface area 110. Furthermore, the first source pad 104 and the second source pad 108 are coupled at the interface area 110.

Figure 2:
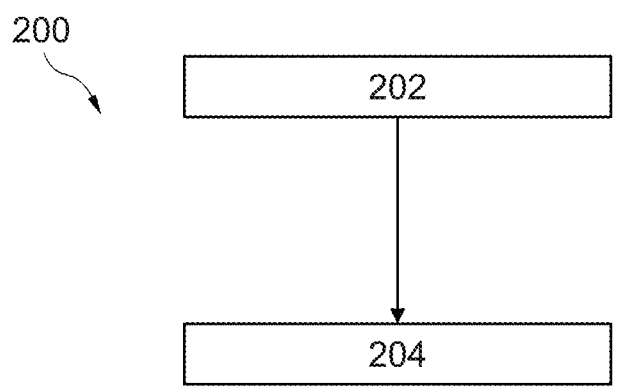
FIG. 2 illustrates a flowchart of a method of manufacturing a package according to an exemplary embodiment.

FIG. 2 illustrates a flowchart 200 of a method of manufacturing a package 100 according to an exemplary embodiment. The reference signs used for the following description of said manufacturing method relate to the embodiment of FIG. 1.

As illustrated by block 202, the method of manufacturing package 100 comprises stacking first transistor chip 102, having first source pad 104, and second transistor chip 106, having second source pad 108, at interface area 110. As indicated by block 204, the method may further comprise coupling the first source pad 104 and the second source pad 108 at the interface area 110.

Figure 6:
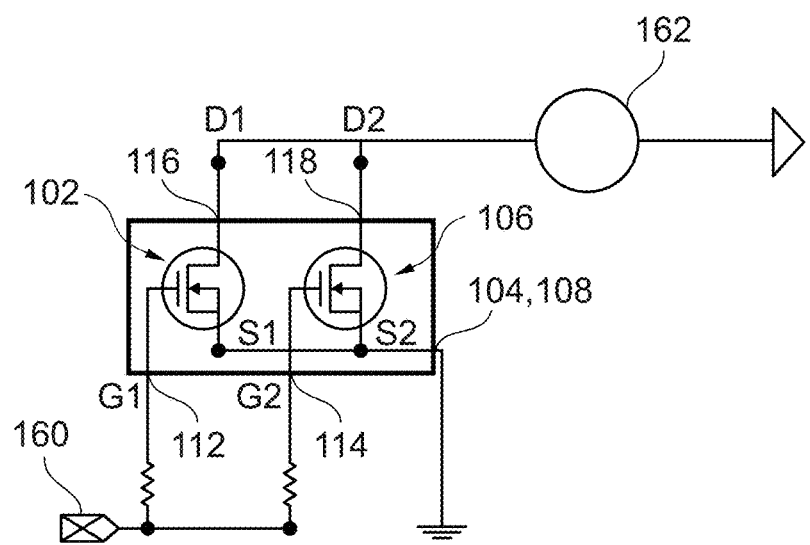
FIG. 6 illustrates a circuit diagram of the aforementioned package.

FIG. 3 to FIG. 5 and FIG. 7 and FIG. 8 illustrate different views of a package 100 according to another exemplary embodiment. FIG. 6 illustrates a circuit diagram of the aforementioned package 100.

The illustrated package 100 comprises a first transistor chip 102 which is embodied as MOSFET and can be manufactured for example in silicon technology. The first transistor chip 102 has a first source pad 104, a first gate pad 112 and a first drain pad 116, wherein reference is made to the configuration of FIG. 1. Moreover, package 100 comprises a second transistor chip 106 arranged above the first transistor chip 102 and having a second source pad 108, a second gate pad 114 and a second drain pad 118, wherein reference is again made to the configuration of FIG. 1. Also the second transistor chip 106 may be embodied as MOSFET and can be manufactured for example in silicon technology. For example, the transistor chips 102, 106 may be identical in terms of shape, dimension and functionality. Each of the first transistor chip 102 and the second transistor chip 106 is configured for a vertical current flow, i.e. through semiconductor material of the respective chip 102, 106 between their opposing main surfaces.

Advantageously, the first source pad 104 and the second source pad 108 are coupled with each other at an interface area 110. The interface area 110 denotes the portion of the package 100 between the mutually connected main surfaces of the transistor chips 102, 106. In other words, the transistor chips 102, 106 may be source-coupled at the position of their physical coupling. This may significantly improve the heat removal capability of the package 100. Also the first gate pad 112 of the first transistor chip 102 and the second gate pad 114 of the second transistor chip 106 are arranged at the interface area 110 side-by-side and laterally spaced with respect to the coupled source pads 104, 108. The first drain pad 116 is arranged at a main surface of the first transistor chip 102 facing away from the interface area 110. Correspondingly, the second drain pad 118 is located at a main surface of the second transistor chip 106 facing away from the interface area 110.

As shown, the first transistor chip 102 is mounted, preferably by soldering, on a carrier 120, which may be embodied as a leadframe (i.e. as a patterned metal plate for instance made of copper). More precisely, the first drain pad 116 at the bottom main surface of the first transistor chip 102 may be soldered on a top surface of the carrier 120.

Figure 3:
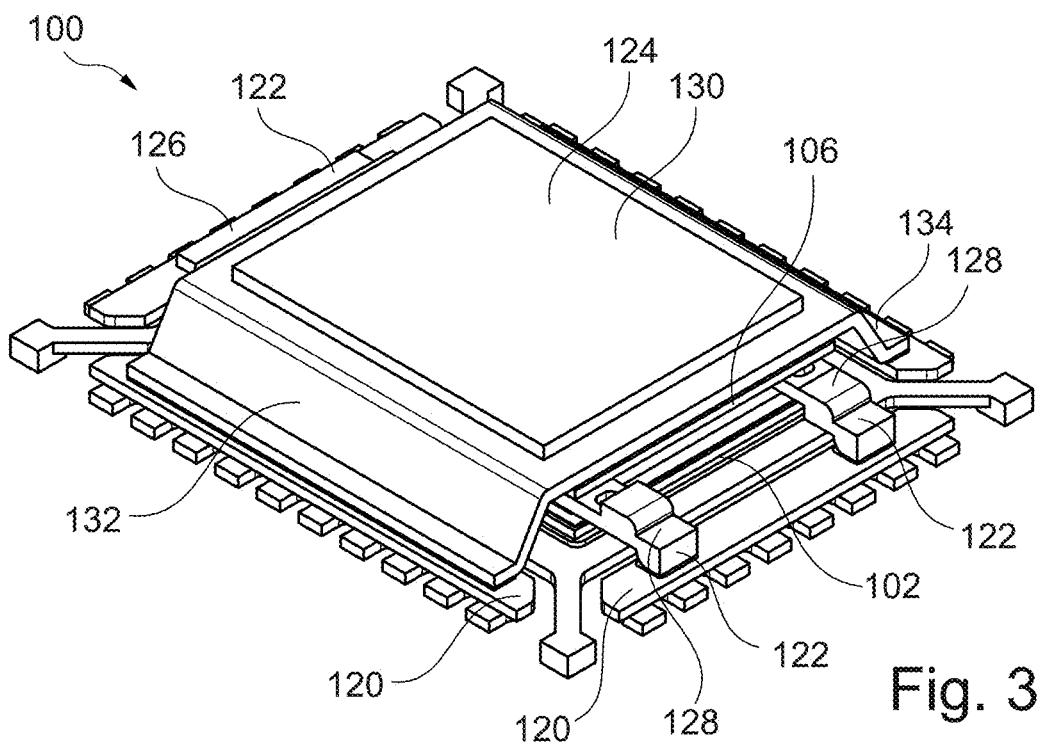
Figure 4:
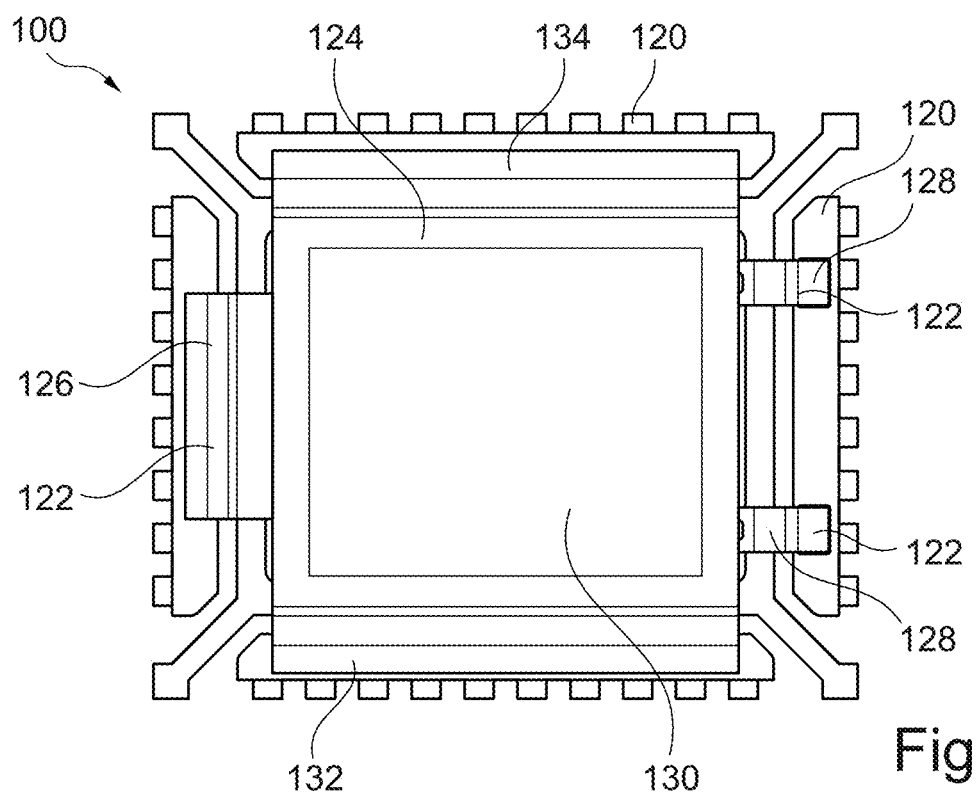
Figure 5:
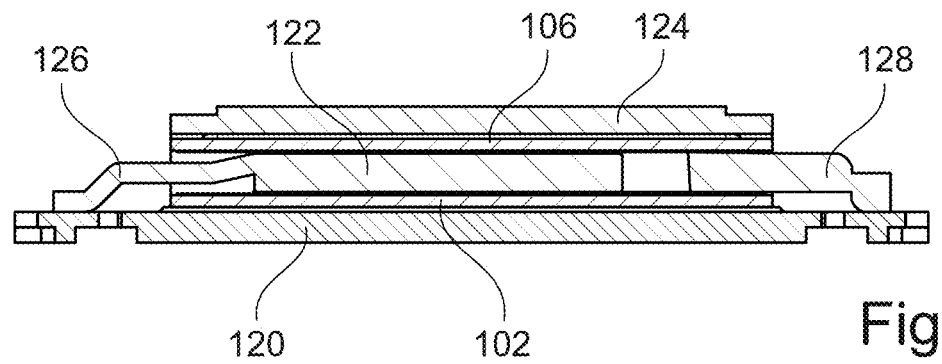

An electrically conductive first clip 122 may be partially sandwiched between the interface area 110 and the carrier 120. Moreover, the first clip 122 has a first coupling section 126 coupling the first source pad 104 and the second source pad 108 with the carrier 120. In addition, the first clip 122 has a second coupling section 128 coupling the first gate pad 112 and the second gate pad 114 with the carrier 120. As best seen in FIG. 3 and FIG. 4, the first coupling section 126 and the second coupling section 128 are arranged at two opposing sides of the first clip 122. As best seen in FIG. 8, the first clip 122 may be composed of three island-shaped substructures, i.e. the bent metal plate-type first coupling section 126 to be arranged in the interface area 110, as well as two additional metal structures constituting the second coupling section 128.

In addition, the package 100 comprises an electrically conductive second clip 124 having a substantially flat first portion mounted on a top side of the second transistor chip 106 and having a second portion connecting the first portion with the carrier 120. The second clip 124 electrically and thermally couples the second drain pad 118 with the carrier 120. As already mentioned, the second clip 124 has the first portion embodied as plate-shaped section 130 on the second drain pad 118. Furthermore, the above mentioned second portion of the second clip 126 is composed of two opposing coupling sections 132, 134 extending downwardly from the plate-shaped section 130 for coupling the plate-shaped section 130 with the carrier 120. Unlike the first clip 122, the second clip 124 is here embodied as a single integral metallic structure, as best seen in FIG. 8.

Via the electrically and thermally conductive carrier 120, the first drain pad 116 on a lower main surface of the first transistor chip 102 is electrically and thermally connected. Via the electrically and thermally conductive second clip 124 in combination with the carrier 120, the second drain pad 118 is electrically and thermally connected. In particular, this configuration electrically couples the drain pads 116, 118 with each other. Advantageously, the first drain pad 116 covers substantially the entire lower main surface of the first transistor chip 102. Correspondingly, the second drain pad 118 covers substantially the entire upper main surface of the second transistor chip 106. This exposes both large-area drain pads 116, 118 at or close to opposing main surfaces of the package 100. Thus, the first drain pad 116 is thermally coupled with an exterior of the package 100 for removing heat. At the same time, also the second drain pad 118 is thermally coupled with an exterior of the package 100 for removing heat. This leads to double-sided cooling and therefore a highly efficient heat removal during operation of the power semiconductor-type package 100.

As only shown in FIG. 8, the package 100 may be overmolded by a mold-type encapsulant 136, i.e. a mold compound. Encapsulant 136 encapsulates the first transistor chip 102 and the second transistor chip 106, as well as parts of clips 122, 124 and a part of carrier 120. As indicated by an opening 137 in encapsulant 136 of FIG. 8, an upper main surface of second clip 124 remains exposed after encapsulation. Consequently, an upper main surface of the second clip 124 is exposed beyond the encapsulant 136. This may advantageously promote heat removal via the top side of the package 100.

Again referring to FIG. 8, solder structures 164 may be provided between carrier 120 and first transistor chip 102, between first transistor chip 102 and first clip 122, between first clip 122 and second transistor chip 106, and between second transistor chip 106 and second clip 124 for establishing solder connections.

Now specifically referring to FIG. 6, G1 denotes the gate of the first transistor chip 102, S1 denotes the source of the first transistor chip 102, and D1 denotes the drain of the first transistor chip 102. Correspondingly, G2 denotes the gate of the second transistor chip 106, S2 denotes the source of the second transistor chip 106, and D2 denotes the drain of the second transistor chip 106. As shown, the first gate pad 112 may be coupled with the second gate pad 114 so that a single control signal may be applied to both gate pads 112, 114. As can also be taken from FIG. 6, the first transistor chip 102 and the second transistor chip 106 are connected to function as a single common transistor. Package 100 is thus configured as stacked parallel MOSFET package. A control signal for controlling said single common transistor may be applied via a gate terminal 160. A resulting signal at drain pads 116, 118 may be supplied to a load 162, for instance a motor.

Advantageously, package 100 with the vertically stacked source-coupled transistor chips 102, 106 generates only a limited amount of heat and thereby strongly suppresses undesired hotspots. Consequently, package 100 with its stacked source-coupled transistor chips 102, 106 has a low thermal resistance and a high current gain rendering it perfectly appropriate for power semiconductor applications with high thermal reliability and high performance. Also the current carrying capacity and the power output of package 100 is excellent. At the same time, the vertical stacking of the transistor chips 102, 106 leads to a highly compact package 100. Arranging substantially full-surface drain pads 116, 118 close to two opposing exterior main surfaces of the package 100 enables double-sided cooling for further improving the heat removal capability.

Figure 10:
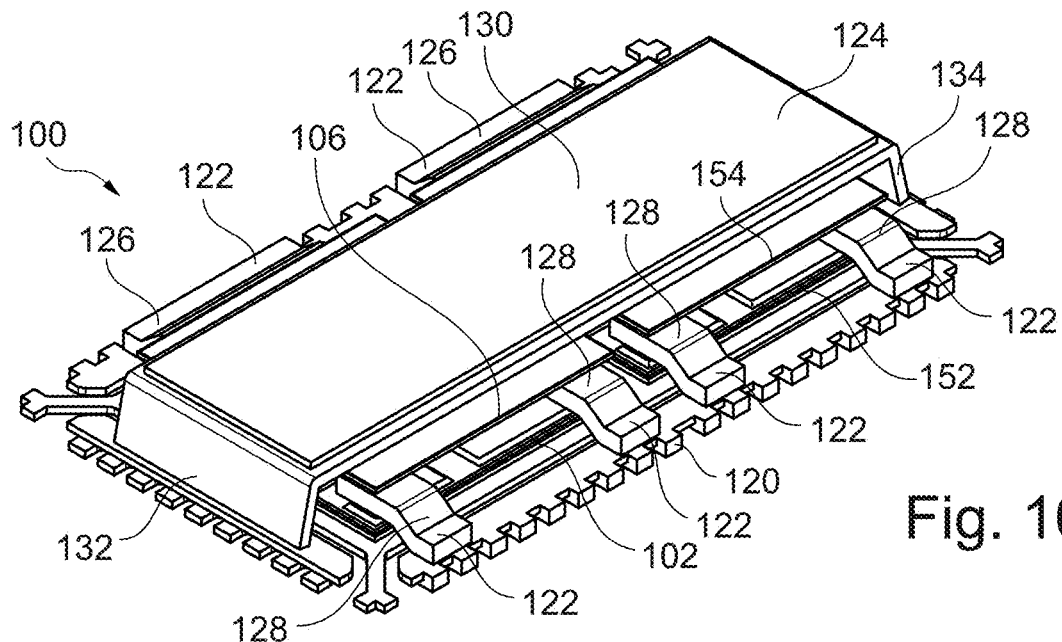
Figure 11:
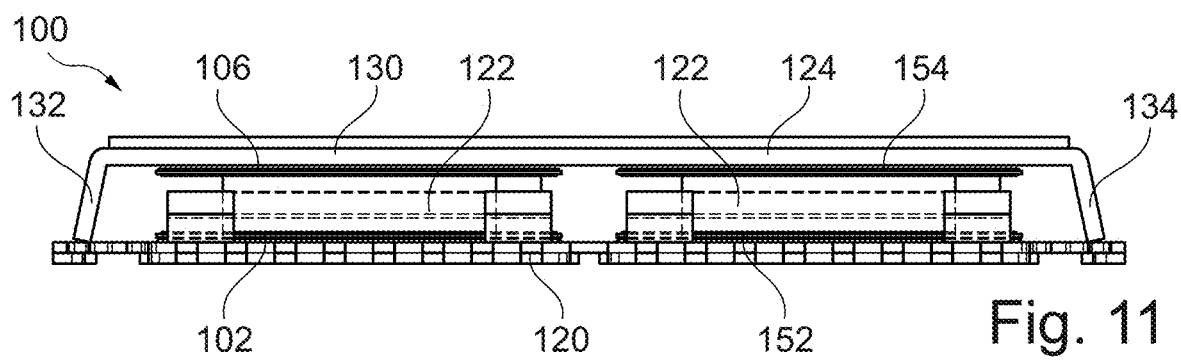

FIG. 9 to FIG. 11 illustrate different views of a package 100 according to another exemplary embodiment.

The embodiment of FIG. 9 to FIG. 11 differs from the previously described embodiment in particular by the additional provision of a third transistor chip 152 and a fourth transistor chip 154 stacked on the third transistor chip 152. The arrangement of source pad, drain pad, and gate pad of third transistor chip 152 may be identical as for first transistor chip 102. The arrangement of source pad, drain pad, and gate pad of fourth transistor chip 154 may be identical as for second transistor chip 106. The stack composed of the third transistor chip 152 and the fourth transistor chip 154 may be arranged laterally to the other stack composed of the first transistor chip 102 and the second transistor chip 106. An additional first clip 122 may be provided for the stack of transistor chips 152, 154 and may be identical to first clip 122 used for transistor chips 102, 106. Second clip 124 may be spatially extended to span over and connect all transistor chips 102, 106, 152, 154 in the fashion described above for transistor chips 102, 106. Hence, as best seen in FIG. 11, a first stack of the first transistor chip 102 and the second transistor chip 106, and a second stack of the third transistor chip 152 and the fourth transistor chip 154 share the second clip 124 to thereby establish a particularly compact configuration.

FIG. 9 to FIG. 11 show that the package design according to exemplary embodiments is freely scalable. Multiple two-chip stacks of MOSFETs can be arranged laterally or side-by-side, in accordance with the requirements of a specific application.

Figure 12:
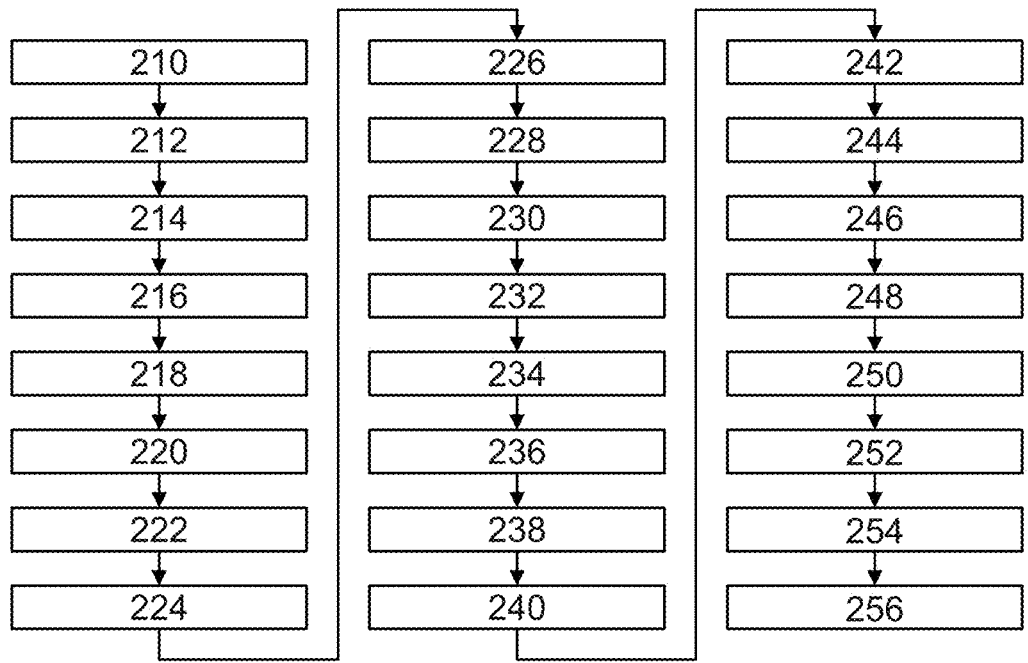
FIG. 12 illustrates a process flow of manufacturing a package according to another exemplary embodiment.

FIG. 12 illustrates a process flow of manufacturing a package 100 according to another exemplary embodiment.

Block 210 indicates solder screen printing on the carrier. Block 212 indicates bottom chip bonding. Block 214 indicates solder screen printing on the bottom chip. Block 216 indicates bonding of the first clip on the bottom chip. Block 218 indicates solder screen printing on the first clip. Block 220 indicates top flip chip die bonding. Block 222 indicates solder screen printing on the top chip. Block 224 indicates bonding of the second clip on the top chip. Block 226 indicates reflow soldering. Block 228 indicates flux cleaning. Block 230 indicates plasma processing. Block 232 indicates wire bonding. Block 234 indicates plating a morphological adhesion promoter. Block 236 indicates a front of the line quality control. Block 238 indicates molding. Block 240 indicates post mold curing. Block 242 indicates chemical deflashing. Block 244 indicates a water jet treatment. Block 246 indicates tin plating. Block 248 indicates a visual inspection. Block 250 indicates laser marking. Block 252 indicates package sawing. Block 254 indicates an end of the line quality control. Block 256 indicates shipment to test.

Figure 13:
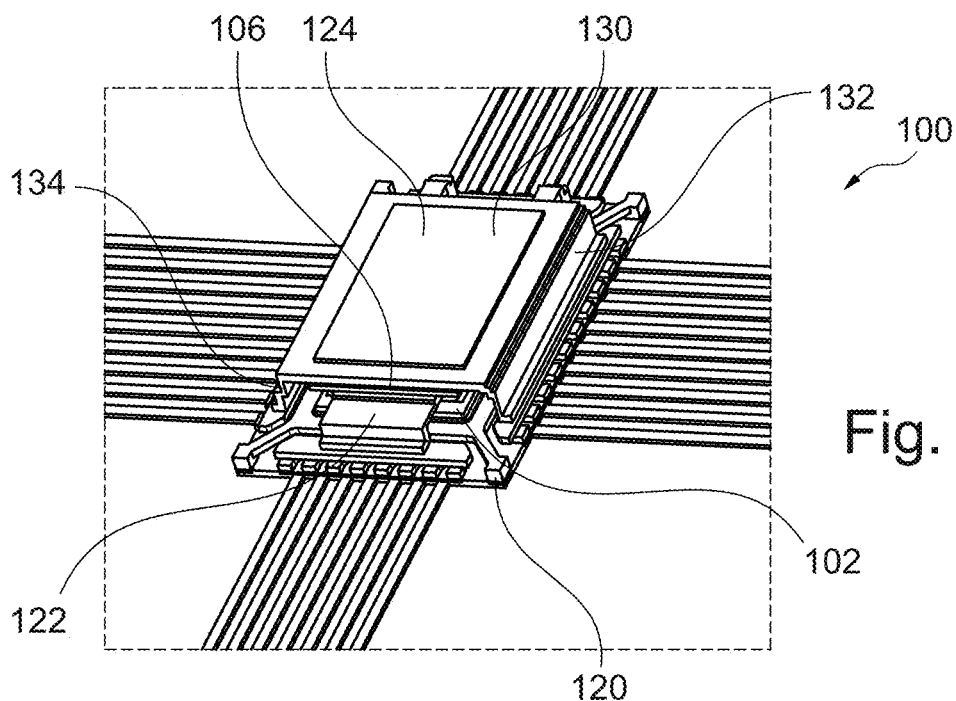
FIG. 13 and FIG. 14 illustrate different views of a model for simulating a temperature behavior of a package according to another exemplary embodiment.
Figure 14:
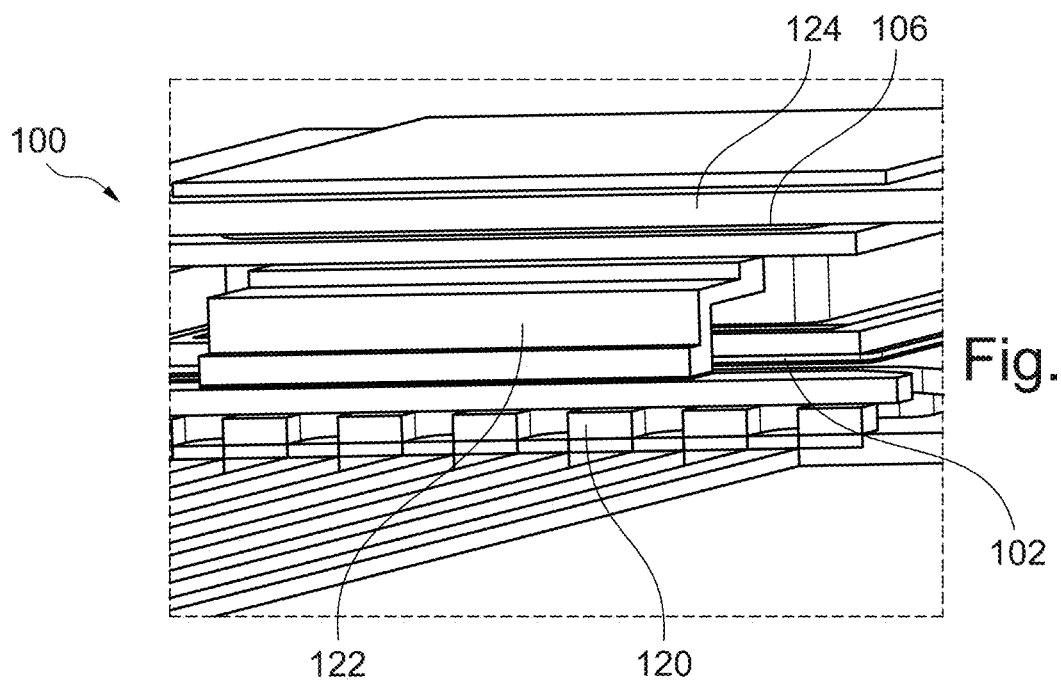
Figure 15:
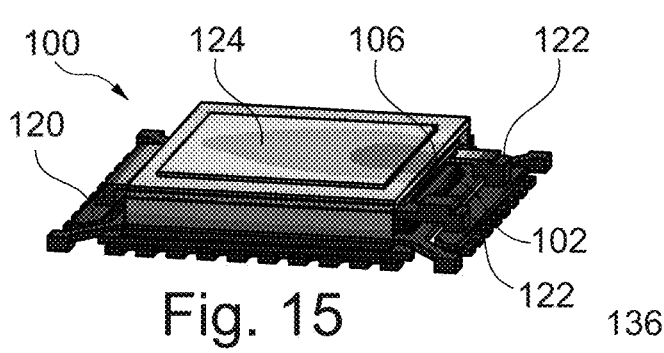
FIG. 15 and FIG. 16 illustrate results of the simulation of the temperature behavior.
Figure 16:
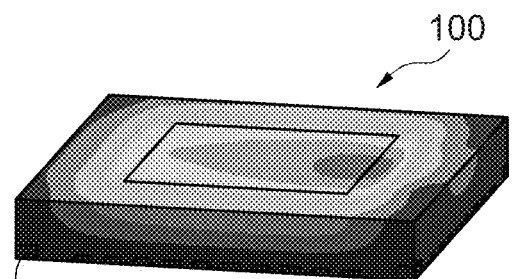

FIG. 13 and FIG. 14 illustrate different views of a model for simulating a temperature behavior of a package 100 according to an exemplary embodiment. FIG. 15 and FIG. 16 illustrate results of the simulation of the temperature behavior. The result of the thermal simulation according to FIG. 13 to FIG. 16 is that packages 100 according to exemplary embodiments show an improved thermal characteristic as compared to benchmark packages.

FIG. 17 to FIG. 19 and FIG. 21 illustrate different views of a package 100 according to another exemplary embodiment. FIG. 20 illustrates a circuit diagram of the aforementioned package 100.

A main difference between the embodiment of FIG. 17 to FIG. 21 as compared to FIG. 3 to FIG. 8 is that, according to FIG. 17 to FIG. 21, the first gate pad 112 and the second gate pad 114 may be configured to be separately controllable. Rather than providing a single gate terminal 160 as shown in FIG. 6, two separate gate terminals 160A, 160B are provided according to FIG. 20. This allows an independent application of a first gate signal to be applied to the gate of the first transistor chip 102 and a second gate signal to be applied to the gate of the second transistor chip 106.

As best seen in FIG. 17, the first coupling section 126 of the first clip 122 is arranged on two opposing sides of the first clip 122. On one further side of the first clip 122 in between said two opposing sides, the second coupling section 128 is located.

FIG. 22 to FIG. 24 illustrate different views of a package 100 according to another exemplary embodiment.

A main difference between the embodiment of FIG. 22 to FIG. 24 as compared to FIG. 17 to FIG. 21 is that, according to FIG. 22 to FIG. 24, an adhesive layer 166 is arranged between two stacked pieces 122A, 122B of the first clip 122. Such an adhesive layer 166 may be made of a non-conductive or a conductive adhesive. This allows to provide a two-pieces first clip 122, the pieces 122A, 122B being connected with each other by the adhesive material.

Figures 25, 26:
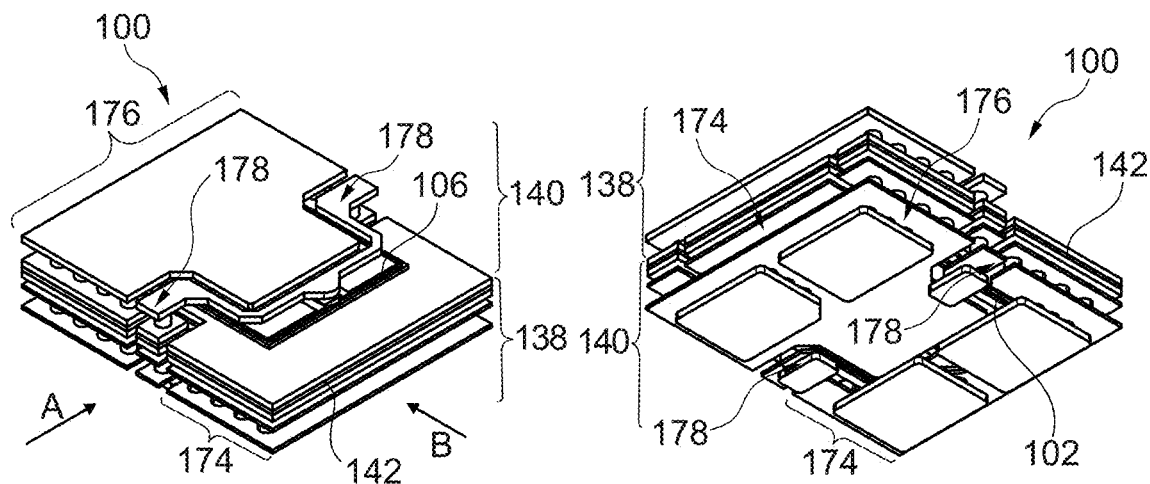
FIG. 25 to FIG. 30 illustrate a package according to another exemplary embodiment.
Figures 27, 28:
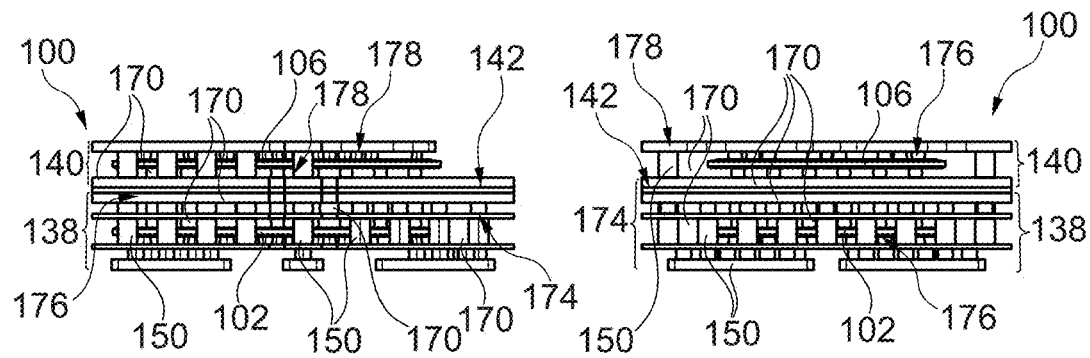
Figure 29:
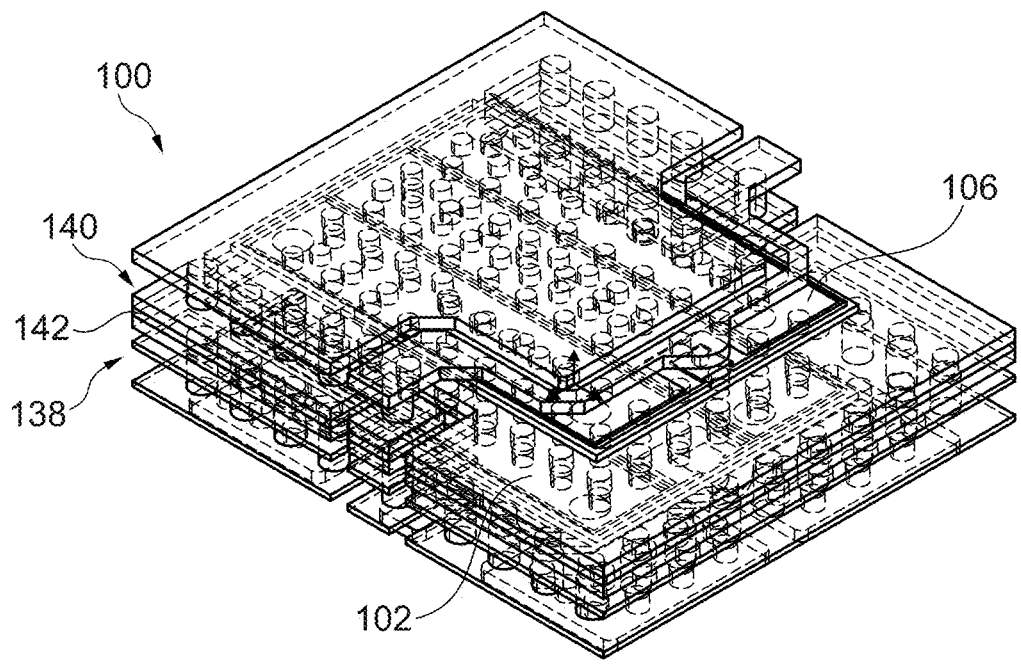
Figure 30:
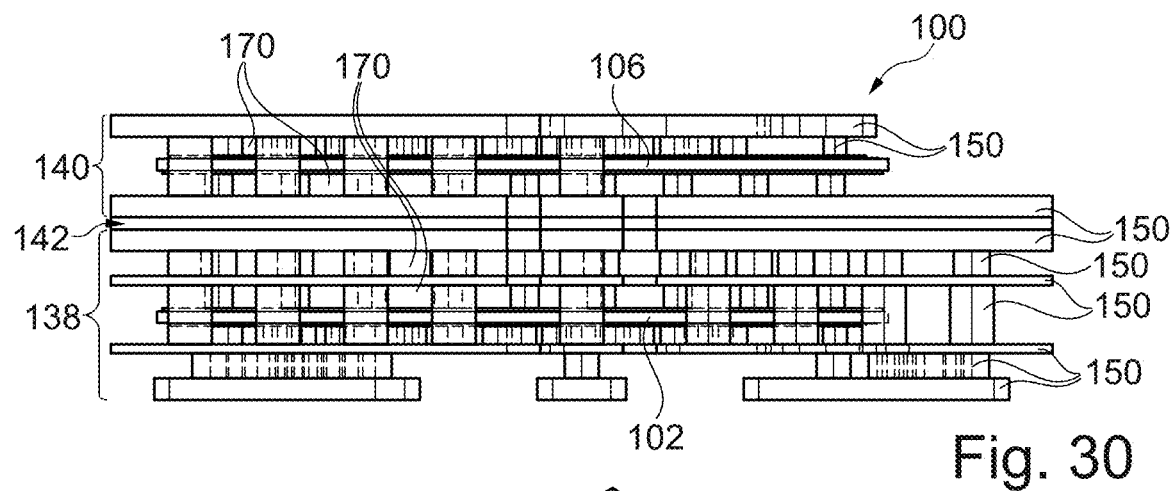

FIG. 25 to FIG. 30 illustrate a package 100 according to another exemplary embodiment. FIG. 25 and FIG. 26 show different three-dimensional views of package 100. FIG. 27 is a side view from viewing direction A shown in FIG. 25. FIG. 28 is a further side view from viewing direction B shown in FIG. 25. FIG. 29 is a semitransparent view indicating the positions of transistor chips 102, 106 within package 100. FIG. 30 is a further side view. Descriptively speaking, FIG. 25 to FIG. 28 illustrate a stacked twin embedded chips embodiment of package 100. FIG. 29 and FIG. 30 illustrate the positions of the transistor chips 102, 106 in the package 100.

The package 100 shown in FIG. 25 to FIG. 30 comprises a first laminate 138 in which the first transistor chip 102 is embedded. The first laminate 138 with embedded first transistor chip 102 can be embodied as a printed circuit board (PCB) with first transistor chip 102 in an interior processed by chip embedding. Furthermore, a second laminate 140 is provided in which the second transistor chip 106 is embedded. The second laminate 140 with embedded second transistor chip 106 can be embodied as a further printed circuit board (PCB) with second transistor chip 106 in an interior processed by chip embedding.

More specifically, each of the laminates 138, 140 comprises dielectric layers 170 (for example prepreg layers) pressed together preferably at an elevated temperature with metallic structures 150 to thereby form the respective interconnected laminate 138, 140. The metallic structures 150 may comprise horizontal structured copper layers as well as vertical copper vias. By the metallic structures 150, the respective transistor chip 102, 106 and in particular its source, drain and gate pads may be electrically connected. Inter alia, the metallic structures 150 may electrically couple the transistor chips 102, 106, for instance in the way as shown in FIG. 6 or FIG. 20.

The two PCBs may be interconnected by a connection structure 142 which may be embodied as a solder structure. Connection structure 142 is arranged between the first laminate 138 and the second laminate 140 and is configured for coupling the first transistor chip 102 with the second transistor chip 106.

For manufacturing package 100 according to FIG. 25 to FIG. 30, the first transistor chip 102 may be embedded in the first laminate 138. Separately from this, the second transistor chip 106 may be embedded in the second laminate 140. Thereafter, the first laminate 138 may be solder-connected with the second laminate 140 by the electrically conductive connection structure 142 embodied as solder structure.

In FIG. 25 to FIG. 28, a source path is denoted with reference sign 174, a drain path is denoted with reference sign 176, and a gate path is denoted with reference sign 178.

Package 100 according to FIG. 25 to FIG. 30 comprises two modules in form of laminates 138, 140 on the top side and on the bottom side, respectively, connected by solder-type connection structure 142. Details of a process flow for manufacturing said package 100 is shown in FIG. 31 to FIG. 36. The excellent electromagnetic performance of said package 100 has been confirmed by three-dimensional simulations. According to these simulation results, said package 100 has a small resistance. This result may be achieved by duplication of the total active area in the twin chip package 100.

Figure 35:
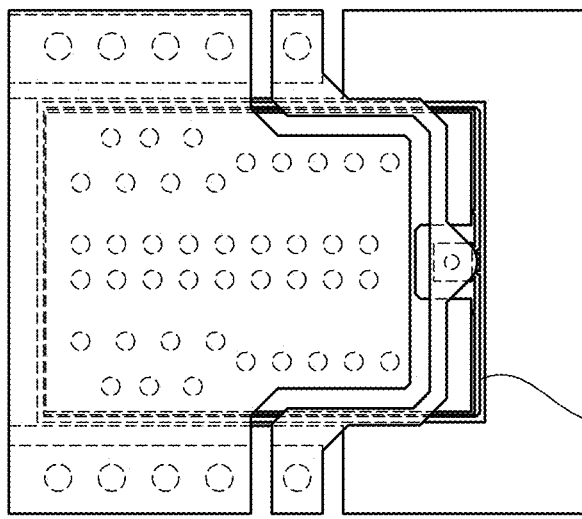
Figure 36:
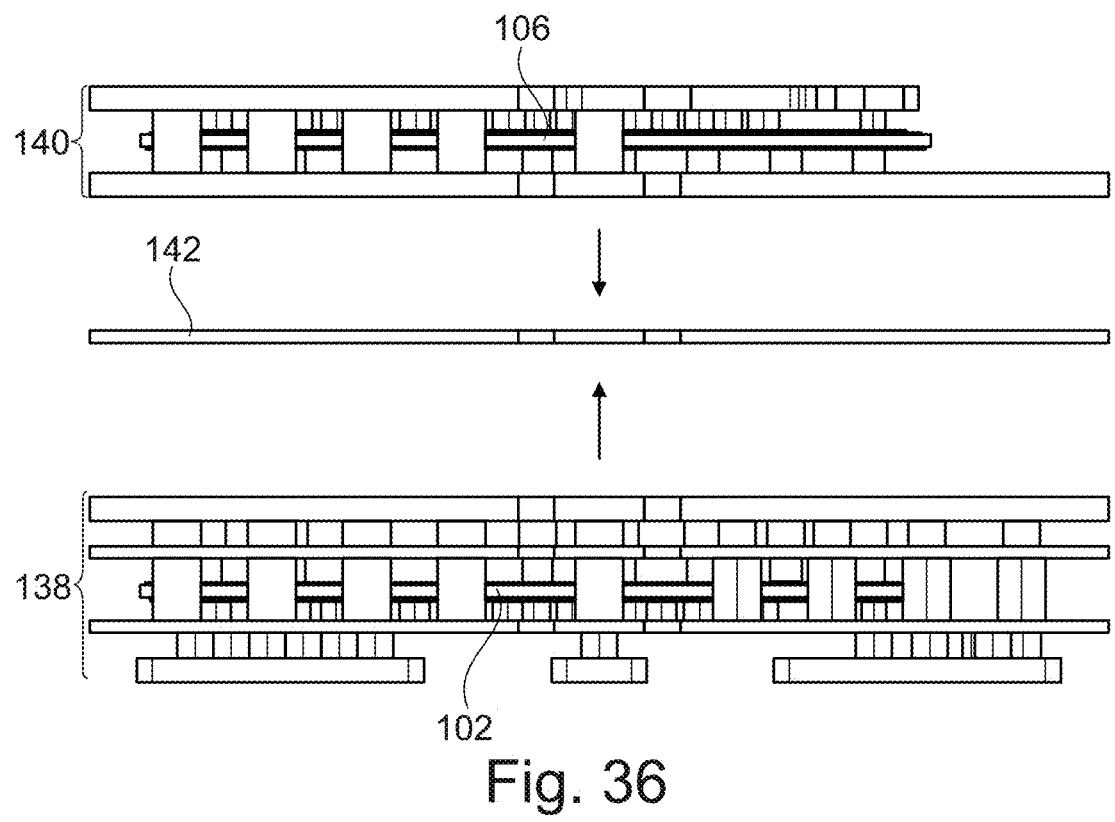
Figure 37:
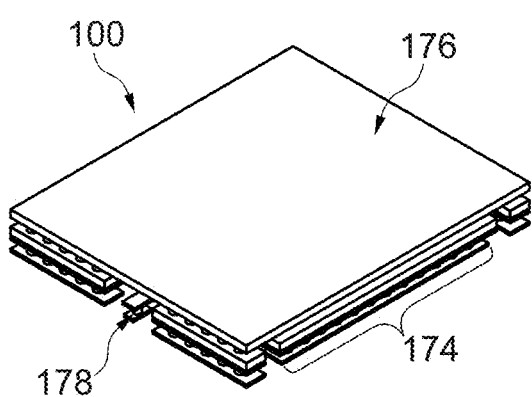
FIG. 37 to FIG. 40 illustrate a package according to another exemplary embodiment.
Figure 38:
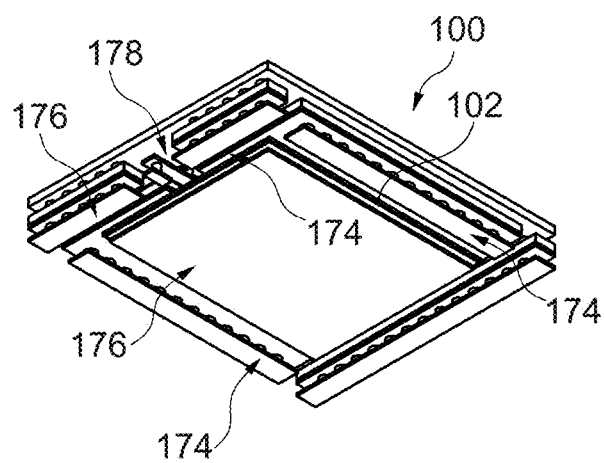
Figure 39:
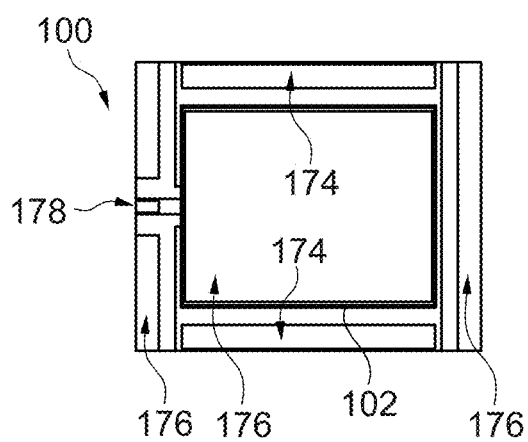
Figure 40:
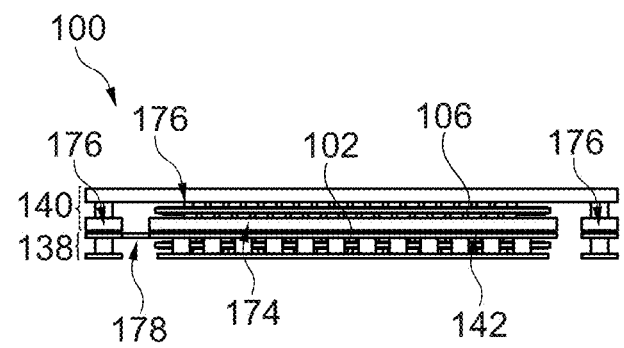

FIG. 31 to FIG. 35 illustrate different views of a package 100, compare FIG. 25 to FIG. 30, manufactured according to FIG. 36 according to another exemplary embodiment.

Figure 31:
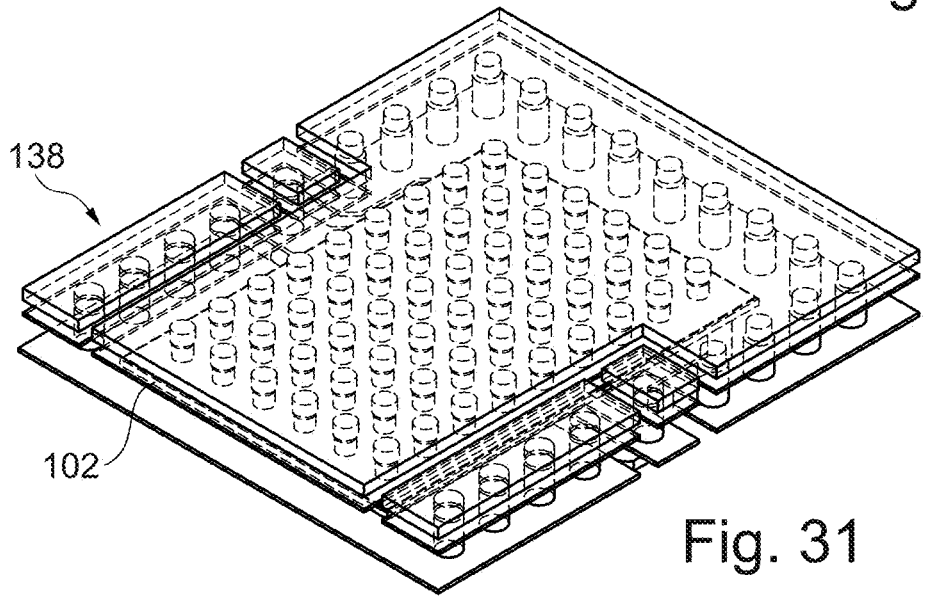
FIG. 31 to FIG. 35 illustrate different views of constituents of a package manufactured according to FIG. 36 according to an exemplary embodiment.
Figure 32:
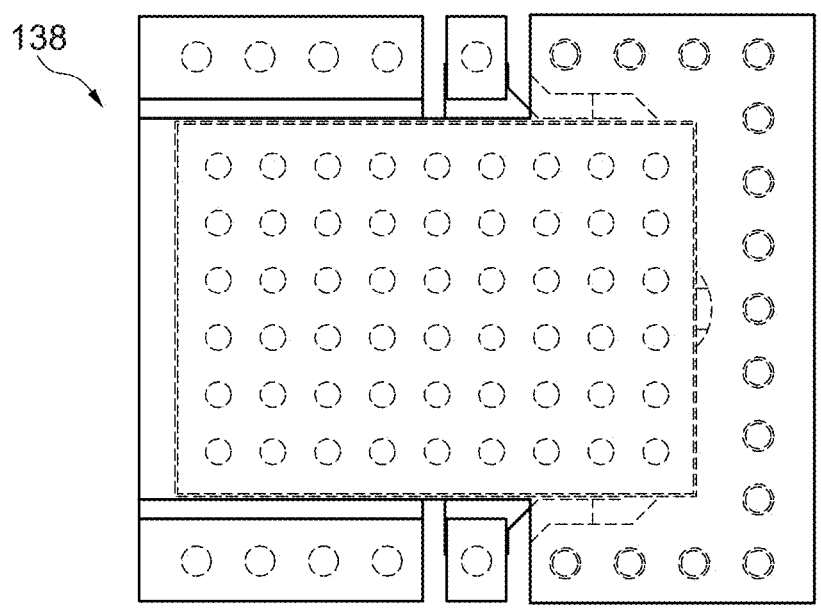
Figure 33:
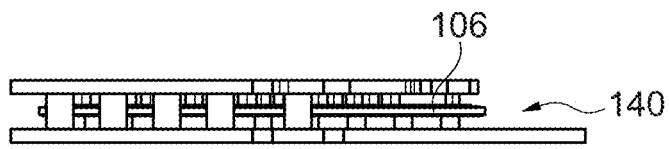
Figure 34:
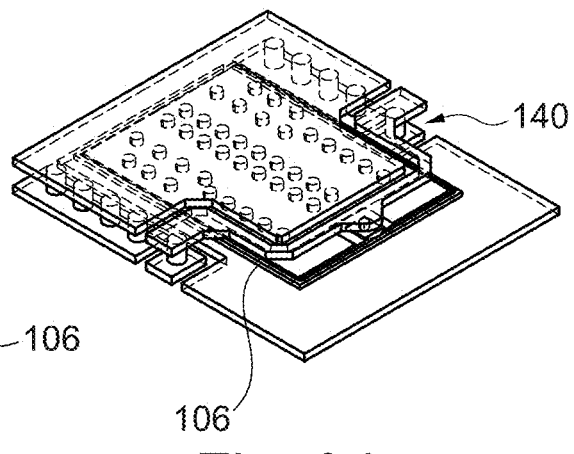

More precisely, FIG. 31 and FIG. 32 show a three-dimensional view and a plan view, respectively, of first laminate 138 used as bottom module for manufacturing package 100 according to FIG. 25 to FIG. 30. FIG. 33, FIG. 34 and FIG. 35 illustrate a side view, a three-dimensional view and a plan view, respectively, of the second laminate 140 used as top module for manufacturing package 100 according to FIG. 25 to FIG. 30. Descriptively speaking, second laminate 140 may be a simplified and flipped clone of first laminate 138. FIG. 36 illustrates how laminates 138, 140 are connected by solder-type connection structure 142.

FIG. 37 to FIG. 40 illustrate a package 100 according to another exemplary embodiment. Package 100 according to FIG. 37 to FIG. 40 can be denoted as a stacked twin embedded chips discrete device with four-directional current flow.

More specifically, FIG. 37 to FIG. 40 show a package 100 with improved electromagnetic performance by employing a four-directional current flow. Four-directional current flow may increase an effective cross section area and, consequently, may significantly reduce package resistance. In addition, crossing and oppositely directed currents flowing in the package 100 may reduce its parasitic inductance.

Figure 41:
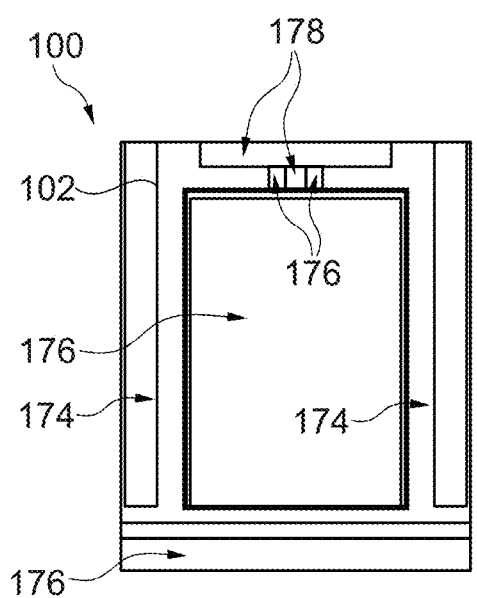
FIG. 41 and FIG. 42 compare different packages according to other exemplary embodiments.
Figure 42:
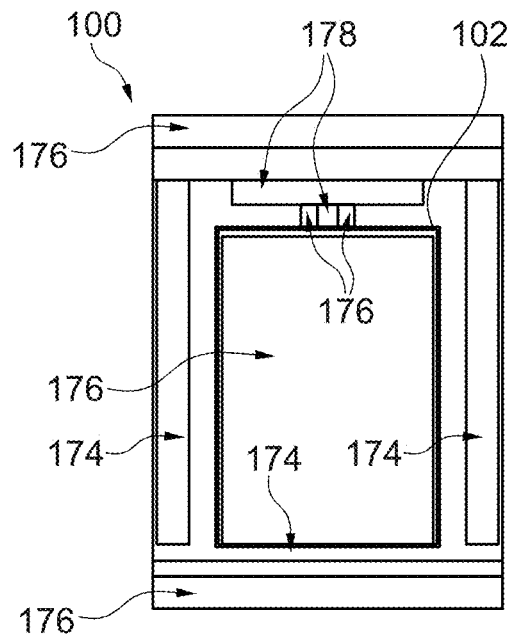

FIG. 41 and FIG. 42 compare different packages 100 according to other exemplary embodiments. The packages 100 according to FIG. 41 and FIG. 42 are modifications or other possible footprint types of the package architecture according to FIG. 37 to FIG. 40.

Package 100 according to FIG. 41 has a more compact footprint than package 100 according to FIG. 37 to FIG. 40 and experiences a three-dimensional current flow. Package 100 according to FIG. 42 has a lower resistance than package 100 according to FIG. 37 to FIG. 40.

Figure 43:
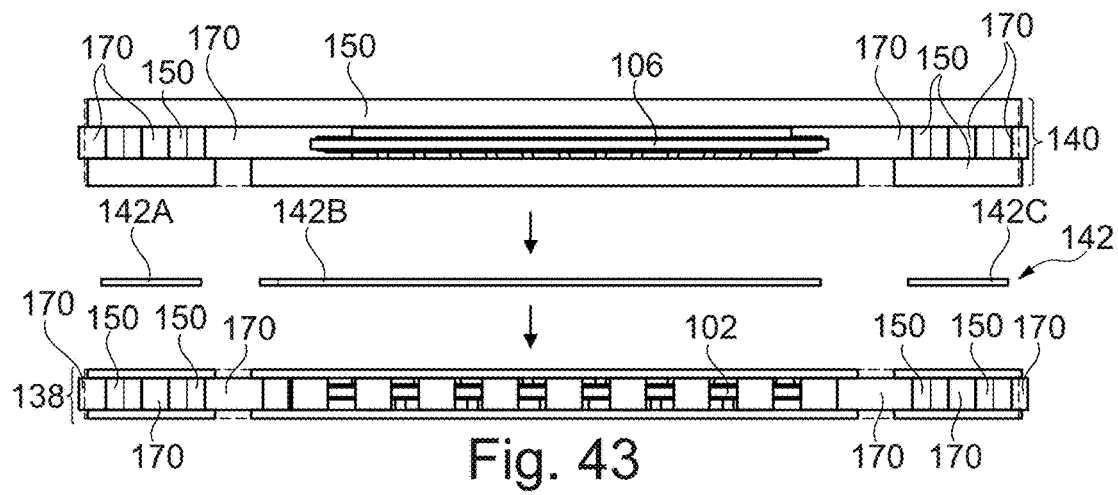
FIG. 43 shows a manufacturing process and FIG. 44 illustrates an obtained package according to another exemplary embodiment.
Figure 44:
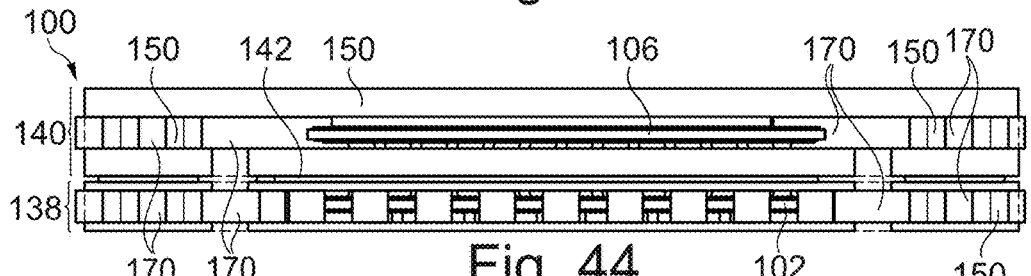

FIG. 43 shows a manufacturing process and FIG. 44 illustrates an obtained package 100 according to another exemplary embodiment.

The manufacturing process according to FIG. 43 is similar to the manufacturing process described above referring to FIG. 36. FIG. 43 shows that the connection structure 142 can be composed of a plurality of separate island-shaped substructures 142A, 142B, 142C, such as different regions of solder material. For example, the substructures 142A, 142B, 142C may be applied on an upper main surface of laminate 138 or a lower main surface of laminate 140 before connecting laminates 138, 140 with each other by soldering the island-shaped substructures 142A, 142B, 142C.

As can be taken from FIG. 43, each of the laminates 138, 140 may be provided with metallic structures 150 of the above described type. As shown in FIG. 44, these metallic structures 150 cooperate for coupling the first transistor chip 102 with the second transistor chip 106. In the shown embodiment, the metallic structure 150 may comprise continuous and/or patterned metal layers, as well as vertical metal elements (such as pillars or vias). As shown, a part of the metallic structures 150 connects a top side of the second transistor chip 106 in the second laminate 140 with a bottom side of the first laminate 138 of the package 100. In this context, said part of the metallic structure 150 extends to laterally enclose the embedded first transistor chip 102 and the embedded second transistor chip 106.

Hence, package 100 according to FIG. 44 is composed of two modules (bottom and top) in form of laminates 138, 140 each having an embedded transistor chip 102, 106. Each laminate 138, 140 can be manufactured separately. Thereafter, the laminates 138, 140 can be connected, for example by soldering using connection structure 142.

The embodiment of FIG. 44 is based on component embedding technology. In order to reduce the ohmic resistance and in order to improve the heat removal capability, the metallic structures 150 may comprise a thick metal layer (for example a copper foil having a thickness of 150 μm) at an upper main surface of package 100. More generally, said thick metal layer may for example have a thickness in the range from 100 μm to 200 μm.

Figure 45:
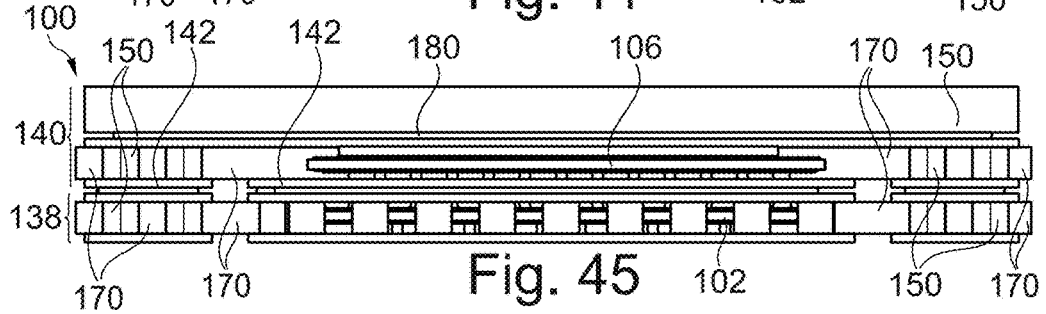
FIG. 45 to FIG. 47 illustrate packages according to other exemplary embodiments.

FIG. 45 illustrates a package 100 according to another exemplary embodiment. The embodiment of FIG. 45 differs from the embodiment according to FIG. 44 in particular in that, according to FIG. 45, a metal (in particular copper) plate rather than a copper layer is provided as the uppermost metallic structure 150. Said copper plate may have a thickness of 250 μm. More generally, said metal plate may for example have a thickness in the range from 200 μm to 500 μm. This metal plate-type metallic structure 150 may be connected at an upper main surface of package 100 by a solder structure 180.

Figure 46:
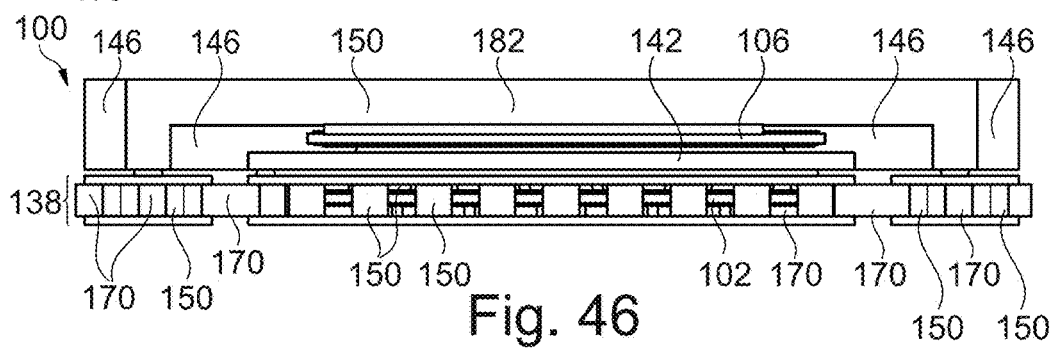

FIG. 46 illustrates a package 100 according to still another exemplary embodiment. The embodiment of FIG. 46 differs from the embodiment according to FIG. 44 in particular in that, according to FIG. 46, the second transistor chip 106 is encapsulated in a mold-type encapsulant 146 rather than being embedded in a laminate. Furthermore, the metallic structures 150 comprise, according to FIG. 46, a clip 182 encapsulated in encapsulant 146 for promoting cooling and for establishing an electric coupling between the transistor chips 102, 106.

More specifically, the embodiment of FIG. 46 comprises a laminate 138 of the above described type in which the first transistor chip 102 is embedded. A mold compound constitutes encapsulant 146 in which the second transistor chip 106 is encapsulated. A connection structure 142 between the transistor chips 102, 106 is here embodied as leadframe, i.e. patterned metal plate. The second transistor chip 106 is mounted on the connection structure 142. The connection structure 142 is arranged between the laminate 138 and the mold compound-type encapsulant 146 and is configured for coupling the first transistor chip 102 with the second transistor chip 106. As the second transistor chip 106, also clip 182 constituting the uppermost metallic structure 150 is encapsulated in encapsulant 146. Clip 182 contributes to an electric coupling between the transistor chips 102, 106. Furthermore, an upper main surface of clip 182 is exposed beyond encapsulant 146 to thereby enable cooling also via a top main surface of package 100. Said clip 182 may have a thickness of 250 μm. More generally, said metal clip 182 may for example have a thickness in the range from 200 μm to 500 μm. Descriptively speaking, package 100 according to FIG. 46 is obtained from a combination of chip embedding and leadframe technologies.

Figure 47:
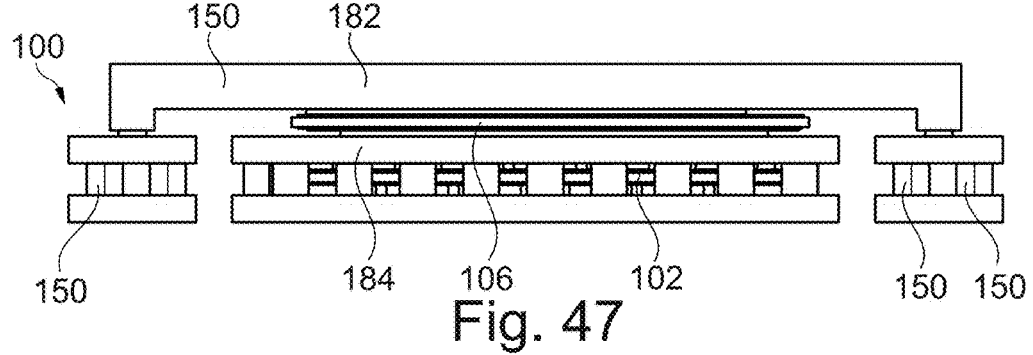

FIG. 47 illustrates a package 100 according to yet another exemplary embodiment. The embodiment of FIG. 47 differs from the embodiment according to FIG. 46 in particular in that, according to FIG. 47, no leadframe-type connection structure 142 is provided between the first transistor chip 102 and the second transistor chip 106. In contrast to this, a thick metal layer 184 is provided between the first transistor chip 102 and the second transistor chip 100. Thick metal layer 184 contributes to both an electrical coupling and a thermal coupling between transistor chips 102, 106. For instance, said metal layer 184 may have a thickness in the range from 100 μm to 200 μm.

Figure 48:
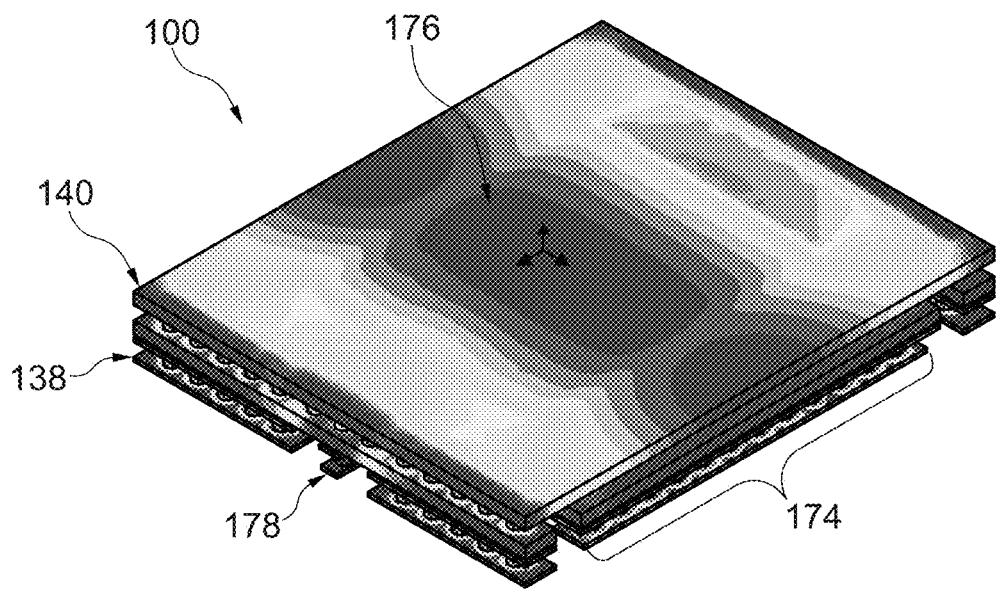
FIG. 48 illustrates a simulated power loss density distribution of a source-coupled package according to an exemplary embodiment.
Figure 49:
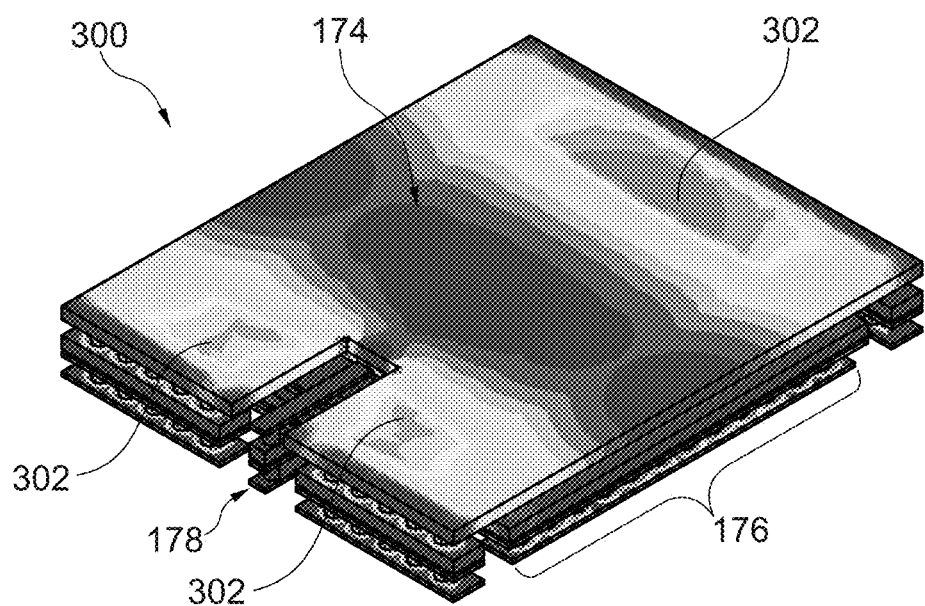
FIG. 49 illustrates a simulated power loss density distribution of a drain-coupled package.

FIG. 48 illustrates a simulated power loss density distribution of a source-coupled package 100 according to an exemplary embodiment. FIG. 49 illustrates a simulated power loss density distribution of a drain-coupled package 300. Just as an example, the power loss density distribution simulation of packages 100 according to exemplary embodiments is discussed on the example of package 100 of FIG. 48 corresponding to the package architecture of FIG. 37 to FIG. 40. Conclusions concerning the thermal reliability and the electric performance of such packages 100 also apply to other embodiments disclosed herein.

More specifically, FIG. 48 and FIG. 49 compare the power loss density distribution behavior of stacked embedded chips discrete devices in common source architecture according to an exemplary embodiment (compare FIG. 48)

versus a common drain approach (compare FIG. 49). In other words, a spatial distribution of ohmic losses over the illustrated main surface of packages 100, 300 is compared in FIG. 48 and FIG. 49. As shown, the common source design has an advantage from the point of view of electrical performance. In the common source design (on the example of a chip embedded embodiment) the current distribution is more homogeneous in the top layer. The common drain design has a cut in the top layer (due to the gate path 178) that leads to areas of concentration of the current density and increases the package resistance as compared with the common source design. The common source design has a cut in the middle layers (common path) that does not affect balancing currents through bottom and top layers and transistor chips 102, 106. Critical areas 302 of package 300 are significantly less pronounced in package 100.

Moreover, the parallel connection of transistor chips 102, 106 reduces the current flowing through each of them. Thus, heat generation in each transistor chip 102, 106 is significantly less as compared with conventional approaches by passage of the same total current. Alternatively, packages 100 according to exemplary embodiments may enable to pass a higher current than conventional packages with the same safety limits. It can be concluded, that in particular packages 100 employing four-directional current flow do not only show a sharp reduction of the device resistance, but also very low package parasitic values. Simulations performed over a frequency range have also shown advantageously only a slow growth of the package resistance with frequency. Hence, together with a very low inductance, packages 100 are in particular highly appropriate for the mid-frequency range (in particular up to 10 MHz).

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, which comprises:
a first transistor chip having a first source pad;
a second transistor chip having a second source pad and being stacked with the first transistor chip at an interface area, where the interface area is an area where the first transistor chip faces the second transistor chip, wherein the first source pad and the second source pad are coupled at the interface area, and wherein the first transistor chip is mounted on a carrier;
wherein a first gate pad of the first transistor chip and a second gate pad of the second transistor chip are arranged at the interface area;
an electrically conductive first clip arranged at least partially in the interface area between the first transistor chip and the second transistor chip, wherein the first clip is coupled to a first side of the carrier; and
an electrically conductive second clip mounted on a top side of the second transistor chip and coupled to a second side of the carrier, wherein the second side is adjacent to the first side.

2. The package according to claim 1, comprising:
the first gate pad is coupled with the second gate pad; or
the first gate pad and the second gate pad are configured to be separately controllable.

3. The package according to claim 1, wherein the first transistor chip has a first drain pad at a main surface of the first transistor chip facing away from the interface area, and/or the second transistor chip has a second drain pad at a main surface of the second transistor chip facing away from the interface area.

4. The package according to claim 3, wherein the electrically conductive second clip couples the second drain pad with the second side of the carrier.

5. The package according to claim 1, wherein the first transistor chip and the second transistor chip are connected to function as a single common transistor.

6. The package according to claim 1, comprising:
the first transistor chip and the second transistor chip have different shapes and/or dimensions.

7. The package according to claim 1, wherein the carrier comprises a leadframe.

8. The package according to claim 1, wherein the electrically conductive first clip has a second coupling section coupling the first gate pad and/or the second gate pad with a third side of the carrier that is opposite to the first side of the carrier.

9. The package according to claim 1, wherein the electrically conductive first clip has a first coupling section coupling the first source pad and the second source pad with the first side of the carrier.

10. The package according to claim 1, comprising an encapsulant, in particular a mold compound, encapsulating at least part of the first transistor chip and at least part of the second transistor chip.

11. The package according to claim 1, comprising a third transistor chip and a fourth transistor chip stacked on the third transistor chip, wherein the third transistor chip and the fourth transistor chip are arranged laterally to the first transistor chip and the second transistor chip.

12. A package, comprising:
a first transistor chip having a first source pad, a first gate pad and a first drain pad;
a second transistor chip having a second source pad, a second gate pad and a second drain pad, wherein the second transistor chip is stacked with the first transistor chip at an interface area;
a first laminate that is a first printed circuit board in which the first transistor chip is embedded, wherein the first laminate includes a first metal structured layer connected to the first source pad, the first gate pad and the first drain pad of the first transistor chip;
a second laminate that is a second printed circuit board in which the second transistor chip is embedded, wherein the second laminate includes a second metal structured layer connected to the second source pad, the second gate pad and the second drain pad of the second transistor chip; and
a connection structure, in particular a solder structure, arranged in the interface area between the first metal structured layer of the first laminate and the second metal structured layer of the second laminate and configured for coupling the first source pad with the second source pad, the first gate pad with the second gate pad, and the first drain pad with the second drain pad of the respective first transistor chip and the second transistor chip.

13. The package according to claim 12, comprising a metallic structure for coupling the first transistor chip with the second transistor chip.

14. The package according to claim 13, wherein the metallic structure comprises at least one of the group consisting of at least one continuous metal layer, at least one patterned metal layer, at least one vertical metal element, and at least one electrically conductive clip.

15. The package according to claim 13, wherein part of the metallic structure connects a top side of the second transistor chip with a bottom side of the package and partially extends to laterally enclose the first transistor chip and the second transistor chip.

16. A package, comprising:
- a first transistor chip having a first source pad, a first gate pad and a first drain pad;
- a second transistor chip having a second source pad, a second gate pad and a second drain pad, wherein the second transistor chip is stacked with the first transistor chip at an interface area between the first transistor chip and the second transistor chip;
- a laminate that is a printed circuit board in which the first transistor chip is embedded, wherein the laminate includes a metal structured layer connected to the first source pad, the first gate pad and the first drain pad of the first transistor chip;
- an encapsulant in which the second transistor chip is encapsulated; and
- a connection structure, in particular a leadframe and a clip, the leadframe arranged in the interface area between the metal structured layer of the laminate and the encapsulant, the leadframe and the clip configured for coupling the first source pad with the second source pad, the first gate pad with the second gate pad, and the first drain pad with the second drain pad of the respective first transistor chip and the second transistor chip.

* * * * *